(12) United States Patent
Roberts et al.

(10) Patent No.: US 9,029,866 B2
(45) Date of Patent: May 12, 2015

(54) GALLIUM NITRIDE POWER DEVICES USING ISLAND TOPOGRAPHY

(75) Inventors: John Roberts, Ottawa (CA); Ahmad Mizan, Ottawa (CA); Girvan Patterson, Ottawa (CA); Greg Klowak, Ottawa (CA)

(73) Assignee: Gan Systems Inc., Ottawa (CA)

( * ) Notice: Subject to any disclaimer, the term of this patent is extended or adjusted under 35 U.S.C. 154(b) by 0 days.

(21) Appl. No.: 13/020,712

(22) Filed: Feb. 3, 2011

(65) Prior Publication Data

US 2011/0186858 A1 Aug. 4, 2011

Related U.S. Application Data

(63) Continuation-in-part of application No. PCT/CA2010/001202, filed on Aug. 4, 2010.

(60) Provisional application No. 61/231,139, filed on Aug. 4, 2009, provisional application No. 61/323,470, filed on Apr. 13, 2010.

(51) Int. Cl.
*H01L 29/41* (2006.01)
*H01L 29/205* (2006.01)

(52) U.S. Cl.
CPC .................................. *H01L 29/205* (2013.01)

(58) Field of Classification Search
CPC . H01L 27/124; H01L 51/0021; H01L 51/102; H01L 33/62; H01L 29/78624; H01L 23/4824; H01L 24/13; H01L 2224/05093; H01L 23/5286; H01L 23/528
USPC .............. 257/76, E29.116, E29.112, E29.091
See application file for complete search history.

(56) References Cited

U.S. PATENT DOCUMENTS 3,783,349 A * 1/1974 Beasom ........................ 257/287
4,152,714 A 5/1979 Hendrickson et al.
(Continued)

FOREIGN PATENT DOCUMENTS

EP 1973163 9/2008
EP 2151852 2/2010
(Continued)

OTHER PUBLICATIONS

Wai Tung Ng et. al. High Speed CMOS output Stage for integrated DC_DC Converters. Solid state and Integrated Circuit Technology 2008. ICSICT 2009. pp. 1909-1912.
(Continued)

*Primary Examiner* — Wael Fahmy
*Assistant Examiner* — Sarah Salerno

(57) ABSTRACT

A semiconductor device in provided having a substrate and a semiconductor layer formed on a main surface of the substrate. A plurality of first island electrodes and a plurality of second island electrodes are placed over the semiconductor layer. The plurality of first island electrodes and second island electrodes are spaced apart from each other so as to be alternatively arranged to produce two-dimensional active regions in all feasible areas of the semiconductor layer. Each side of the first island electrodes is opposite a side of the second island electrodes. The semiconductor device can also include a plurality of strip electrodes that are formed in the regions between the first island electrodes and the second island electrodes. The strip electrodes serve as the gate electrodes of a multi-island transistor. The first island electrodes serve as the source electrodes of the multi-island transistor. The second island electrodes serve as the drain electrodes of the multi-island transistor. A plurality of connections to the gate electrodes are provided at each interstice defined by corners of the first island electrodes and the second island electrodes.

22 Claims, 35 Drawing Sheets

(56) References Cited

U.S. PATENT DOCUMENTS

| | | |
|---|---|---|
| 4,636,825 A | 1/1987 | Baynes |
| 4,819,042 A | 4/1989 | Kaufman |
| 4,821,084 A | 4/1989 | Kinugasa et al. |
| 5,068,603 A | 11/1991 | Mahoney |
| 5,087,950 A * | 2/1992 | Katano .................. 257/472 |
| 5,355,008 A | 10/1994 | Moyer et al. |
| 5,447,876 A | 9/1995 | Moyer et al. |
| 5,633,479 A | 5/1997 | Hirano |
| 5,643,832 A * | 7/1997 | Kim .................. 438/586 |
| 5,714,784 A | 2/1998 | Ker et al. |
| 5,767,546 A | 6/1998 | Williams et al. |
| 5,789,791 A | 8/1998 | Ergemont |
| 5,852,315 A | 12/1998 | Ker et al. |
| 5,883,407 A * | 3/1999 | Kunii et al. .................. 257/275 |
| 6,037,822 A | 3/2000 | Rao et al. |
| 6,084,266 A | 7/2000 | Jan |
| 6,100,549 A | 8/2000 | Weitzel et al. |
| 6,159,841 A | 12/2000 | Williams et al. |
| 6,264,167 B1 | 7/2001 | Hamazawa |
| 6,353,290 B1 | 3/2002 | Glenn et al. |
| 6,388,292 B1 | 5/2002 | Lin |
| 6,477,023 B1 | 11/2002 | Tang et al. |
| 6,555,873 B2 * | 4/2003 | Disney et al. .................. 257/342 |
| 6,639,277 B2 | 10/2003 | Rumennik et al. |
| 6,653,740 B2 | 11/2003 | Kinzer et al. |
| 6,713,793 B1 | 3/2004 | Suzuki et al. |
| 6,713,823 B1 | 3/2004 | Nickel |
| 6,737,714 B2 | 5/2004 | Masuda et al. |
| 6,777,278 B2 | 8/2004 | Smith |
| 6,878,593 B2 | 4/2005 | Khan et al. |
| 6,897,561 B2 | 5/2005 | Nemtsev et al. |
| 6,903,460 B2 | 6/2005 | Fukuda et al. |
| 6,930,329 B2 | 8/2005 | Koide |
| 6,958,543 B2 | 10/2005 | Nakayama |
| 6,972,464 B2 * | 12/2005 | Shen .................. 257/368 |
| 7,033,936 B1 | 4/2006 | Green |
| 7,078,775 B2 | 7/2006 | Yi et al. |
| 7,132,717 B2 | 11/2006 | Su et al. |
| 7,233,028 B2 | 6/2007 | Weeks et al. |
| 7,233,610 B2 | 6/2007 | Lan et al. |
| 7,250,641 B2 * | 7/2007 | Saito et al. .................. 257/192 |
| 7,253,486 B2 | 8/2007 | Green et al. |
| 7,294,892 B2 | 11/2007 | Chen |
| 7,327,007 B2 | 2/2008 | Shimizu |
| 7,335,916 B2 | 2/2008 | Kim et al. |
| 7,352,016 B2 | 4/2008 | Nagy et al. |
| 7,398,498 B2 | 7/2008 | Teig et al. |
| 7,449,762 B1 | 11/2008 | Singh |
| 7,491,986 B2 | 2/2009 | Kumagae et al. |
| 7,550,821 B2 | 6/2009 | Shibata et al. |
| 7,622,318 B2 | 11/2009 | Kobayashi et al. |
| 7,622,779 B2 | 11/2009 | Cheng et al. |
| 7,675,131 B2 | 3/2010 | Derderian |
| 7,727,332 B2 | 6/2010 | Habel et al. |
| 7,732,306 B2 | 6/2010 | Arena et al. |
| 7,750,369 B2 | 7/2010 | Ohta et al. |
| 8,085,553 B1 | 12/2011 | Lacap et al. |
| 8,134,205 B2 | 3/2012 | Tang et al. |
| 8,680,676 B1 | 3/2014 | Jergovic et al. |
| 2001/0015447 A1 | 8/2001 | Shinomiya |
| 2002/0013042 A1 | 1/2002 | Morkoc |
| 2002/0076851 A1 * | 6/2002 | Eden et al. .................. 438/106 |
| 2002/0179005 A1 | 12/2002 | Koike et al. |
| 2002/0197841 A1 | 12/2002 | Nagai et al. |
| 2003/0032288 A1 | 2/2003 | Kozaki et al. |
| 2003/0062622 A1 * | 4/2003 | Pavier et al. .................. 257/734 |
| 2003/0136984 A1 | 7/2003 | Masuda et al. |
| 2003/0183160 A1 | 10/2003 | Fujikura et al. |
| 2003/0209759 A1 | 11/2003 | Blanchard |
| 2003/0218246 A1 | 11/2003 | Abe et al. |
| 2004/0048409 A1 | 3/2004 | Biwa et al. |
| 2004/0125577 A1 | 7/2004 | Vinciarelli et al. |
| 2005/0056865 A1 | 3/2005 | Tsuchiya et al. |
| 2005/0093099 A1 | 5/2005 | Koike et al. |
| 2005/0167775 A1 | 8/2005 | Nagy et al. |
| 2005/0274977 A1 | 12/2005 | Saito et al. |
| 2006/0049417 A1 | 3/2006 | Li et al. |
| 2006/0060895 A1 | 3/2006 | Hikita et al. |
| 2006/0073621 A1 * | 4/2006 | Kneissel et al. .................. 438/21 |
| 2006/0273347 A1 | 12/2006 | Hikita et al. |
| 2007/0072320 A1 | 3/2007 | Frayssinet et al. |
| 2007/0096262 A1 | 5/2007 | Takasone |
| 2008/0073670 A1 | 3/2008 | Yang et al. |
| 2008/0083932 A1 | 4/2008 | Briere |
| 2008/0087915 A1 | 4/2008 | Uemoto et al. |
| 2008/0128752 A1 | 6/2008 | Wu |
| 2008/0149940 A1 | 6/2008 | Shibata et al. |
| 2008/0173898 A1 | 7/2008 | Ohmaki |
| 2008/0224332 A1 | 9/2008 | Tam |
| 2008/0230786 A1 | 9/2008 | Heikman et al. |
| 2008/0246058 A1 | 10/2008 | Nagy et al. |
| 2008/0274621 A1 | 11/2008 | Beach et al. |
| 2008/0303042 A1 | 12/2008 | Minato et al. |
| 2009/0026506 A1 | 1/2009 | Matsumiya et al. |
| 2009/0045394 A1 | 2/2009 | Smeeton et al. |
| 2009/0086506 A1 | 4/2009 | Okumura |
| 2009/0242961 A1 | 10/2009 | Tang et al. |
| 2009/0267188 A1 | 10/2009 | Piner et al. |
| 2009/0315123 A1 | 12/2009 | Wu |
| 2010/0019850 A1 | 1/2010 | Nagy et al. |
| 2010/0059761 A1 | 3/2010 | Horii et al. |
| 2010/0072489 A1 | 3/2010 | McLaurin et al. |
| 2010/0072576 A1 | 3/2010 | Arena |
| 2010/0133548 A1 | 6/2010 | Arena et al. |
| 2010/0163979 A1 | 7/2010 | Hebert |
| 2010/0258843 A1 | 10/2010 | Lidow et al. |
| 2010/0297960 A1 | 11/2010 | Ogawa et al. |
| 2011/0031529 A1 | 2/2011 | Miura et al. |
| 2011/0031532 A1 | 2/2011 | Kikkawa et al. |
| 2011/0041890 A1 | 2/2011 | Sheats |
| 2011/0057311 A1 | 3/2011 | Yutani |
| 2011/0079795 A1 | 4/2011 | Nagai |
| 2011/0115029 A1 | 5/2011 | Van Ben Boom |
| 2011/0186858 A1 | 8/2011 | Roberts et al. |
| 2011/0193096 A1 | 8/2011 | Imada |
| 2012/0126290 A1 | 5/2012 | Uemoto et al. |
| 2012/0138950 A1 | 6/2012 | Roberts et al. |
| 2012/0315743 A1 | 12/2012 | Kikkawa et al. |
| 2013/0049010 A1 | 2/2013 | Roberts et al. |

FOREIGN PATENT DOCUMENTS

| | | |
|---|---|---|
| JP | 5047575 | 4/1975 |
| JP | 5089263 | 7/1975 |
| JP | 5181067 | 6/1976 |
| JP | 5868954 | 4/1983 |
| JP | 11214408 | 8/1999 |
| JP | 2000208759 A | 7/2000 |
| JP | 2007103451 | 4/2007 |
| JP | 2007305954 A | 11/2007 |
| JP | 2008177527 A | 7/2008 |
| WO | 2010015302 | 2/2010 |

OTHER PUBLICATIONS

A.Yoo et al. High Performance Low_Voltage Powers MOSFETs with Hybrid Waffle Layout Structure in a 0.25 um Standard CMOS process. 20th International Symposium on Power Semiconductor Devices and ICs (ISPD '08). p. 95 (2008).

S. Lee. Distributed effects on power transistors and the optimization of the layouts of AlGaN/GaN HFETs, Doctoral dissertation, Graduate School of Ohio State University, Ohio State University. (2006).

Sang Lam et al. An enhanced compact waffle MOSFET with low drain capacitance from a standard submicron CMOS technology. Solid State Electronics 47(2003). Pergamon Press. pp. 785-789.

R. Vemuru. Layout Comparison of MOSFETs with large W/L ratios. Electronic Letters. vol. 28. No. 25. pp. 2327-2329. (1992).

L. Baker et al. A waffle layout technique strengthens the ESD hardness of the NMOS transistor. EOS/ESD Symp. Proc. EOS—11. pp. 175-181. (1989).

Ming-Dou Ker et al. Area-Efficient Layout Design for CMOS Output Transistors. IEEE Transactions on Electron Devices. vol. 44. No. 4. Apr. 1997.

(56) References Cited

OTHER PUBLICATIONS

Notice of Reasons for Rejection, Japanese Patent Office, mailed Jul. 30, 2014.
Karmalkar, Shreepad et al. Enhancement of Breakdown Voltage . . . Using a Field Plate. IEEE Transactions on Electron Devices, vol. 48, No. 8, Aug. 2001.
Xing, H. et al. High Breakdown Voltage . . . Achieved by Multiple Field Plates. IEEE Transactions on Electron Device Letters. vol. 25, No. 4, Apr. 2004.
Koudymov, A. et al. Mechanism of Current Collapse Removal . . . HFETs. IEEE Transactions on Electron Device Letters, vol. 26, No. 10, Oct. 2005.

* cited by examiner

GALLIUM NITRIDE POWER DEVICES USING ISLAND TOPOGRAPHY

CROSS-REFERENCE TO RELATED APPLICATIONS

This application is a Continuation in Part of PCT application number PCT/CA2010/001202, filed on Aug. 4, 2010, which claims priority from U.S. Provisional Application No. 61/231,139, filed on Aug. 4, 2009. This application also claims priority from U.S. Provisional Application No. 61/323,470, filed on Apr. 13, 2010. The entire contents of all the aforementioned applications are incorporated herein by reference.

FIELD OF THE INVENTION

The invention relates generally to topographies of semiconductor devices and to structures used in such topographies.

BACKGROUND OF INVENTION

Gallium nitride materials include gallium nitride and its alloys such as aluminum gallium nitride, indium gallium nitride and aluminum indium gallium nitride. These materials are semiconductor compounds that have a relatively wide, direct bandgap, which permits highly energetic electronic transitions to occur. Gallium nitride materials have a number of attractive properties including high electron mobility, the ability to efficiently emit blue light and the ability to transmit signals at high frequency, among others. Accordingly, gallium nitride materials are being investigated in many microelectronic applications such as transistors and optoelectronic devices.

Despite the attractive properties noted above, a number of challenges exist in connection with developing gallium nitride material-based devices. For example, it may be difficult to grow high quality gallium nitride materials on certain substrates, particularly silicon, due to property difference (e.g., lattice constant and thermal expansion coefficient) between the gallium nitride material and the substrate material. Also, it has been challenging to form gallium nitride material devices meeting the cost requirements for certain applications.

High power and medium power gallium nitride microwave transistors are now available. Conventional gallium nitride transistors use a multifinger structure. The structures are optimised for grounded source circuit applications where it is desirable to minimize the inductance and resistance of the source connection. To this end the transistors are commonly constructed with a series of via connections that subtend the entire vertical structure. These commonly used through-substrate via connections are difficult to manufacture and control. To reach the areas where a smaller number of large vias can be made, air bridges may have to be constructed from each of the source connections, as shown, for example, in U.S. Pat. No. 7,352,016 (Nagy et al.).

In conventional designs of gallium nitride transistors, the source and drain electrodes are interdigitated fingers. The electrodes are connected by air bridges to source pads, which are further, connected by a large via. The drain electrodes are connected to a common drain pad and the gate electrodes are connected to a common gate pad. In a typical example, ten gate electrodes are connected to the gate pad and five drain electrodes are connected to the drain pad. In addition, large vias are required to make a connection to the back of the substrate. In this case, the area required for the nitride semiconductor device is about three times as large as the area of the active region (the area in which source, drain and gate electrodes 400, 402, 410 are located). It is possible to reduce the size of an electrode pad, but such a reduction can reduce the yield. Furthermore, air bridges are a source of manufacturing and handling problems.

U.S. Pat. No. 7,550,821 B2 (Shibata et al.) discloses a nitride semiconductor device in which air bridges are eliminated altogether. A plurality of first electrodes and a plurality of second electrodes are formed (spaced apart from each other) on an active region in a nitride semiconductor layer (which is formed on a main surface of a substrate). An interlayer insulating film is formed on the nitride semiconductor layer. The interlayer insulating film has openings that respectively expose the first electrodes and has a planarized top surface. A first electrode pad is formed in a region over the active region in the interlayer insulating film and is electrically connected to the exposed first electrodes through the respective openings. While the source-substrate contacts (short vias) are placed adjacent to the active areas and are directly connected to the source electrodes, there is an area increase penalty in this multifinger structure. As such, the nitride semiconductor device is limited by the high on-resistance typical of power switching transistors using conventional multifinger structures.

It is an object of the present invention to obviate or mitigate the above disadvantages.

SUMMARY OF THE INVENTION

In accordance with one aspect of the present invention, a semiconductor device is provided having a substrate and a semiconductor layer formed on a main surface of the substrate. A plurality of first island electrodes and a plurality of second island electrodes are placed over the semiconductor layer. The plurality of first island electrodes and second island electrodes are spaced apart from each other so as to be alternatively arranged to produce two-dimensional active regions in all feasible areas of the semiconductor layer. Each side of the first island electrodes is opposite a side of the second island electrodes. The semiconductor device can also include a plurality of strip electrodes that are formed in the regions between the first island electrodes and the second island electrodes. The strip electrodes serve as the gate electrodes of a multi-island transistor. The first island electrodes serve as the source electrodes of the multi-island transistor. The second island electrodes serve as the drain electrodes of the multi-island transistor. A plurality of connections to the gate electrodes are provided at each interstice defined by corners of the first island electrodes and the second island electrodes.

BRIEF DESCRIPTION OF THE DRAWINGS

Embodiments of the invention will now be described by way of example only with reference to the accompanying drawings in which.

DETAILED DESCRIPTION OF THE INVENTION

Figure 1:
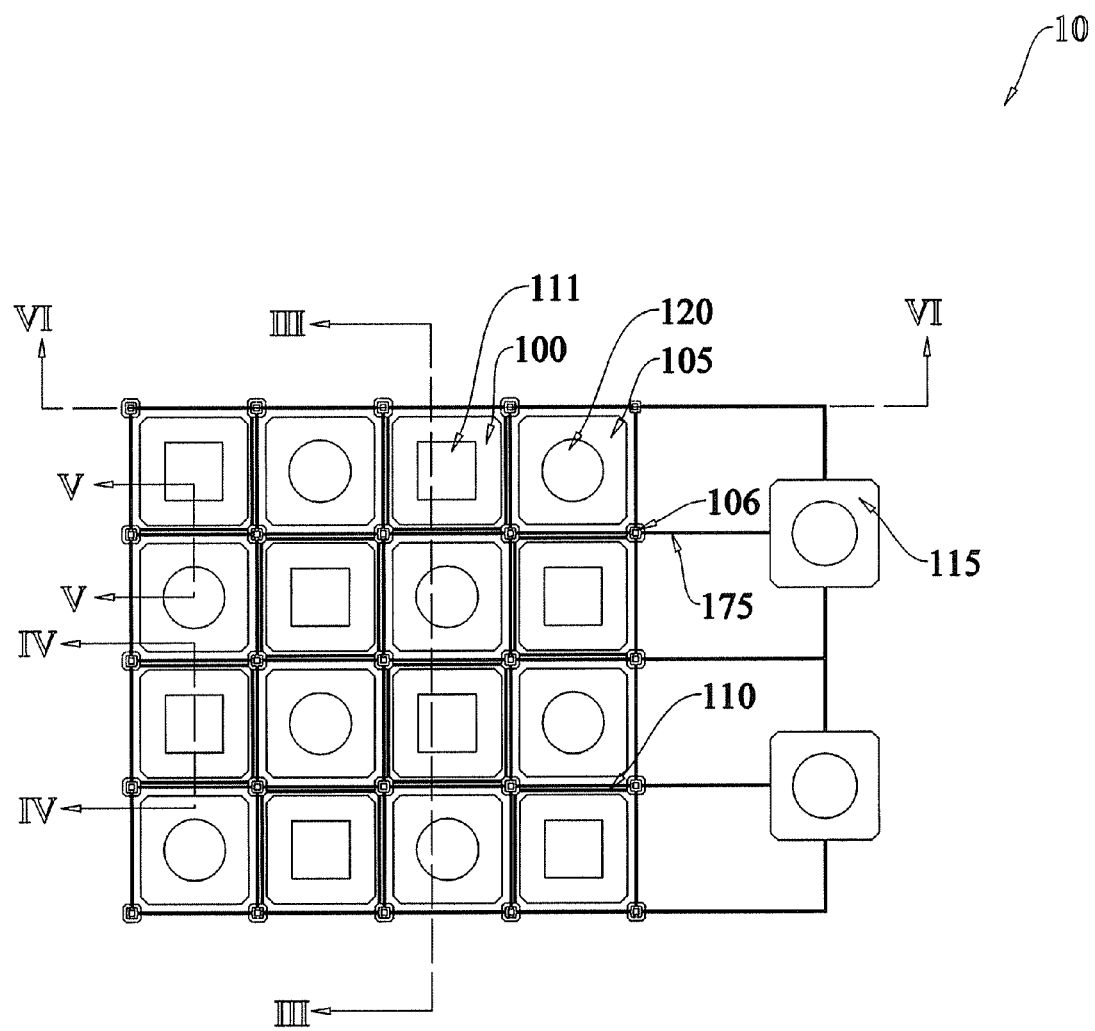
FIG. 1 is a plan view of a nitride semiconductor transistor having an island topography using square island electrodes.

In the following detailed description of the invention, reference is made to the accompanying drawings that form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

Wherever ranges of values are referenced within this specification, sub-ranges therein are intended to be included within the scope of the invention unless otherwise indicated. Where characteristics are attributed to one or another variant of the invention, unless otherwise indicated, such characteristics are intended to apply to all other variants of the invention where such characteristics are appropriate or compatible with such other variants.

The terms wafer and substrate used in the following description include any structure having an exposed surface with which to form the layout topography of the present invention. The terms substrate or wafer are understood to include semiconductor wafers, semiconductor structures during processing and may include other layers that have been fabricated thereupon. Substrate and wafer also include doped and undoped semiconductors, epitaxial semiconductor layers supported by a base semiconductor or insulator and other semiconductor structures known to one skilled in the art. The term conductor is understood to include semiconductors, and the term insulator is understood to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

The accompanying figures are illustrative and are not intended to be drawn to scale. For greater clarity, not every component is labelled in every figure. Throughout the drawings, like reference numerals may be used to describe substantially similar components.

All patent applications and patents incorporated herein by reference are incorporated by reference in their entirety. In case of conflict, the present specification, including definitions, will control.

Referring initially to FIGS. 1 to 6, a semiconductor device 10 is provided. The techniques described will be demonstrated on nitride semiconductor devices, and specifically, gallium nitride transistors or diodes. It can be appreciated that the techniques described may be used on other semiconductors and structures.

The nitride semiconductor device 10 includes an array of electrodes, namely source electrodes 100 and drain electrodes 105. The electrodes 100, 105 are formed on a substrate, 155, which has epitaxial layers 140, 145, 150 disposed on an upper surface 156 of the substrate 155. A buffer layer 135 is interposed between the epitaxial layer 140 and an undoped gallium nitride (GaN) layer 130. An undoped layer 125 of aluminum gallium nitride (AlGaN) is deposited on the GaN layer 130 and the electrodes 100, 105 are formed on the AlGaN layer 125.

The source electrode 100 and drain electrode 105 are separated by a gap 162. In the embodiment shown, the semiconductor device 10 is a transistor and accordingly a gate electrode 110 is located in the gap 162 between the electrodes 100, 105. A via, 111, is formed in each of the source electrodes 100, and extends through the layers to the substrate 155. The via 111 is formed from a conductive metal, such as gold, and overlies the source electrode 100. Each drain electrode 105 is accompanied by a drain bump 120, which can be a conventional ball made of gold. The source electrode 100 and the drain electrode 105 are formed from titanium and aluminum. The gate electrode 110 is formed from palladium.

The electrodes 100, 105 are formed as square islands arranged in an orthogonal matrix across the substrate 155 and separated by the gap 162. The source electrode 100 alternates with a drain electrode 105 in each row and column of the matrix, providing an array in which a side of a source electrode 100 is adjacent to a side of a drain electrode 105, and vice versa. In the embodiment shown, the electrodes are square shaped, but it will be appreciated that other shapes may be used, such as triangular (as shown in subsequent figures), rectangular, trapezoidal, or irregular quadrilateral polygons, provided they can be arranged to ensure that the side of a source electrode is adjacent to the side of a drain electrode. A square electrode is preferred for simplicity of layout and accommodation of connections to the gate electrode.

Figure 2:
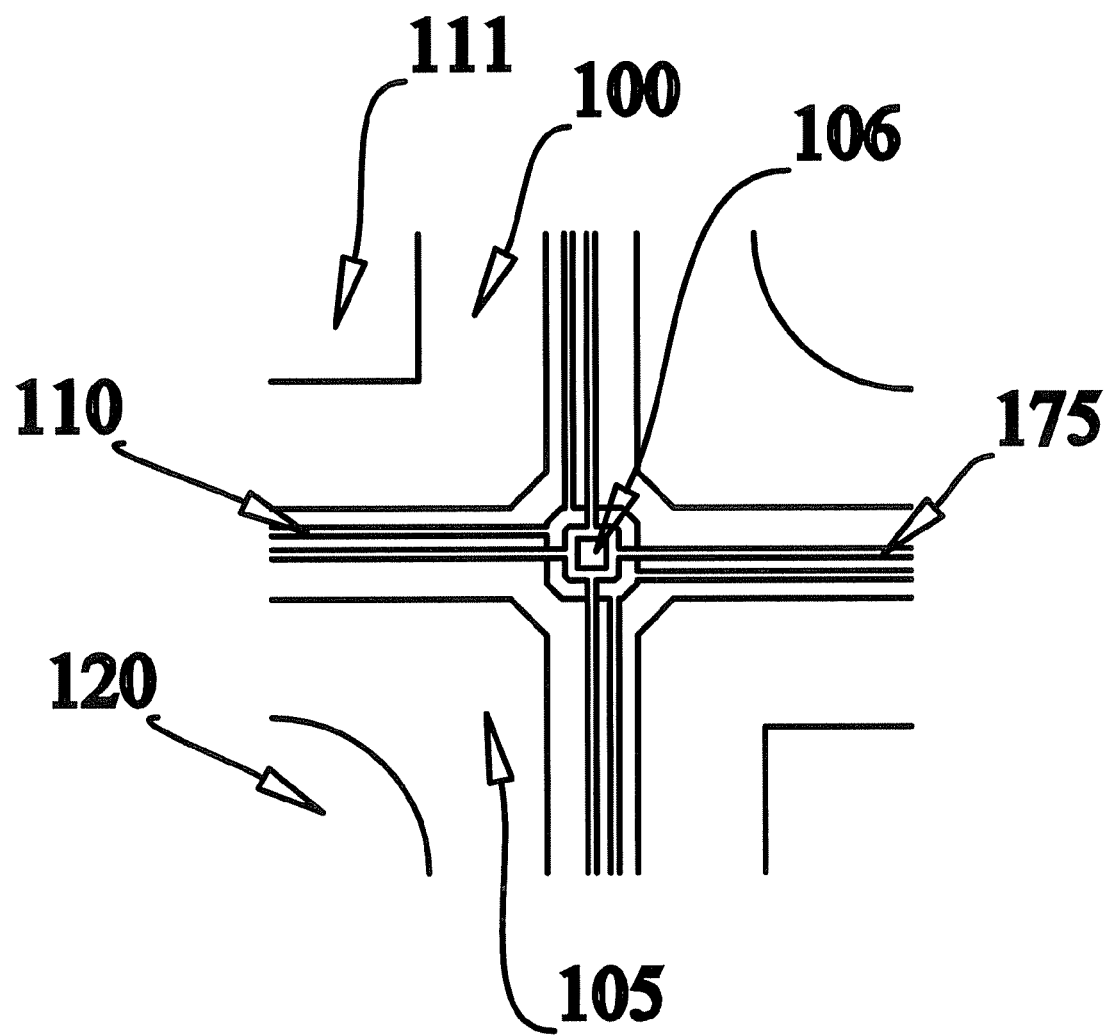
FIG. 2 is a plan view on an enlarged scale of a portion of the device shown in FIG. 1.
Figure 3:
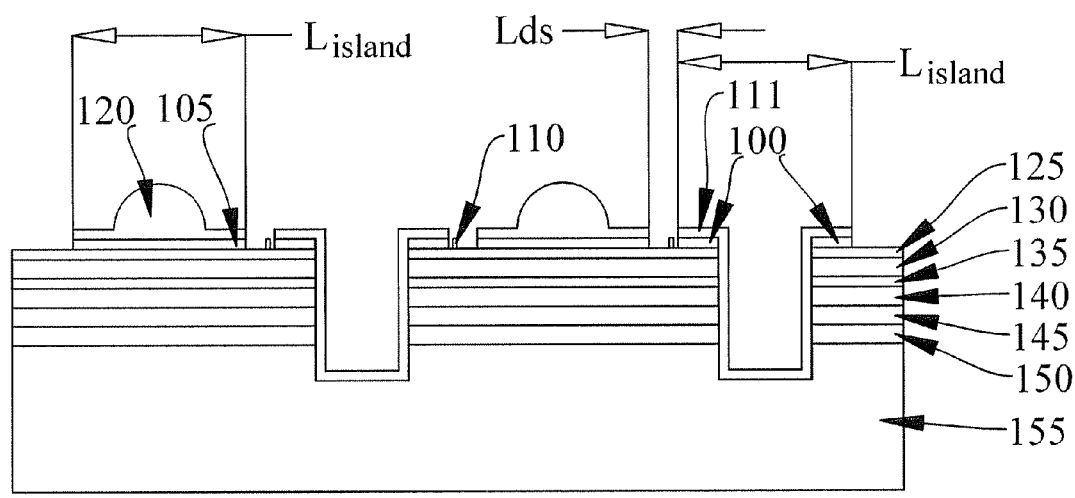
FIG. 3 is a cross-section view along the line III-III of FIG. 1.
Figure 5:
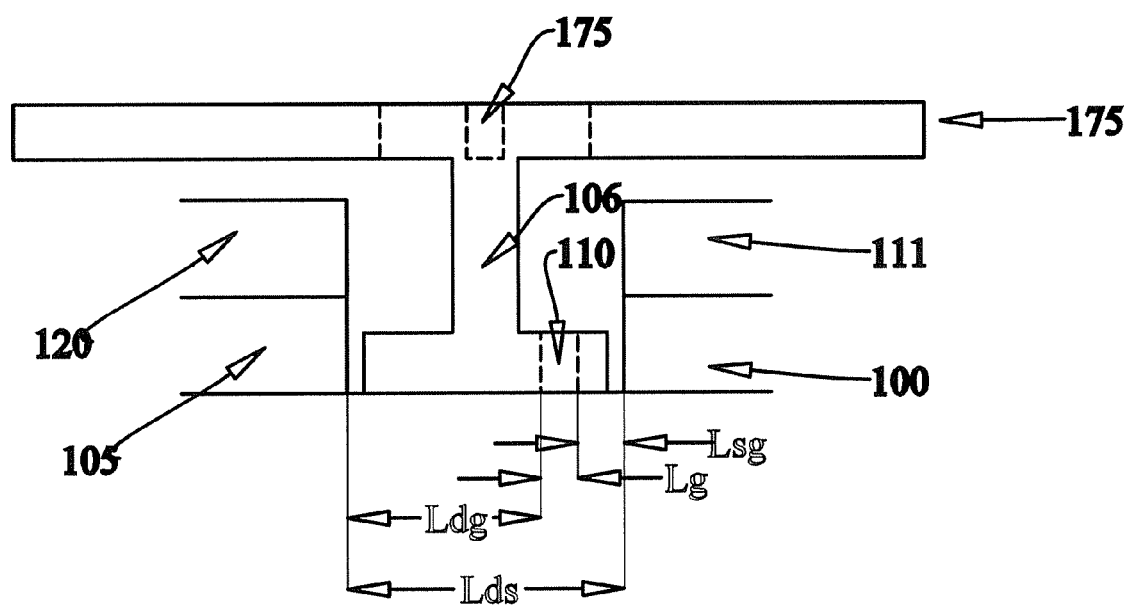
FIG. 5 is a cross-section view along the line V-V of FIG. 2.
Figure 6:
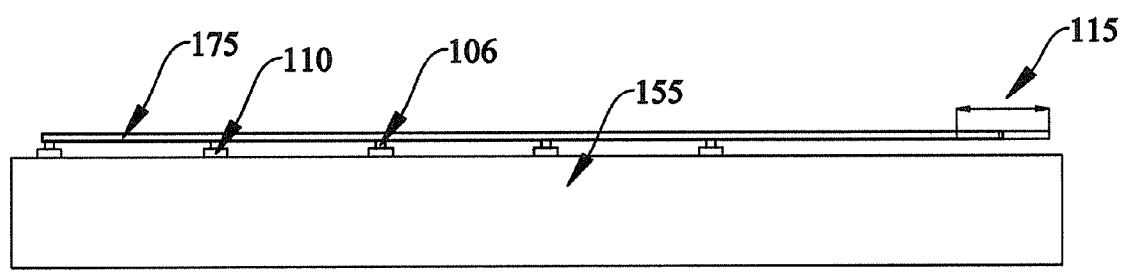
FIG. 6 is a cross-section view along the line VI-VI of FIG. 1.

As noted above, the gate electrode 110 is accommodated in the gap 162 and extends around the source electrode between each side of the source electrode and the adjacent drain electrode. The gate electrode 110 is connected to a gate strap 175 by a gate contact 106. As best seen in FIG. 5, the gate contact 106 is a post that projects in to the intersection of the gaps 162 at the vertices of the electrodes 100, 105. The gate contact 106 engages both of the gate electrodes 110 at the vertex, as shown in FIG. 2, and therefore provides a connection to multiple gate electrodes 110. The gate contact 106 extends upwardly beyond the electrodes 100, 105 for connection to a gate strap 175. The gate strap 175 extends along, but above the gap 162 with a connection to gate contacts at each vertex. The strap 175 connects to a gate pad 115. In this manner, the gate electrode 110 in between each source electrode 100 and drain electrode 105 is connected through the contact 106 to the strap 175. The current carried by the gate electrode is therefore the current required for control of that transistor, rather than the array of transistors. The gate strap 175, which is above the level of the electrodes, may be dimensioned to carry the required aggregate of the gate currents without impacting on the spacing between the electrodes. The size of the overall device 10 may thus be reduced and generation of heat likewise reduced to facilitate the overall dissipation of heat.

By using a multiplicity of small short vias 111 to access the source island electrodes, the use of air bridges or through-substrate source electrode via connections are unnecessary. The adjacent positioning of the substrate contacts (short vias) does not impair the active area density. Sources and drains can be made to consist only of islands that are reduced in size to allow the positioning of only a ball grid or/and via grid within each source and drain island electrode. As a result, bonds and air bridges are not needed.

Large gallium nitride devices, especially high and medium power gallium nitride transistors that operate at high temperatures, can have thermal gradients that impair performance. In one embodiment, the connection system for each source and/or drain includes a separate thermal sink. Since all large gallium nitride transistors have a plurality of source/drain electrodes, this feature allows each source and drain connection to be separately compensated, both resistively and thermally, depending on the particular position of these connections in the overall structure of the transistor.

The arrangement of gate electrodes and gate straps permits the arrangement of source and drain electrodes to be optimised. Each of the electrodes 100, 105 has a side with a dimension identified as an island length $L_{island}$ in FIG. 3. Adjacent sides of source and drain island electrodes are spaced a distance apart designated by the source to drain spacing Lds (FIG. 5). The source to drain spacing Lds is the total of the source to gate edge spacing Lsg, the gate length Lg and the drain to gate edge spacing Ldg.

A primary factor in determining the source to drain spacing Lds is the drain to gate edge spacing Ldg, which governs the breakdown voltage of the device. Accordingly, the desired breakdown voltage can be used to determine the required drain to gate edge spacing Ldg. The gate length Lg can be determined by performance criteria such as minimizing gate resistance for the gate current to be carried. The source to gate edge spacing Lsg can be chosen to be the minimum allowed by the layout design rule limitations (e.g. the resolution available for individual features). As a result, the source to drain spacing Lds can be determined from the desired design specifications and in particular the breakdown voltage.

Figure 7A:
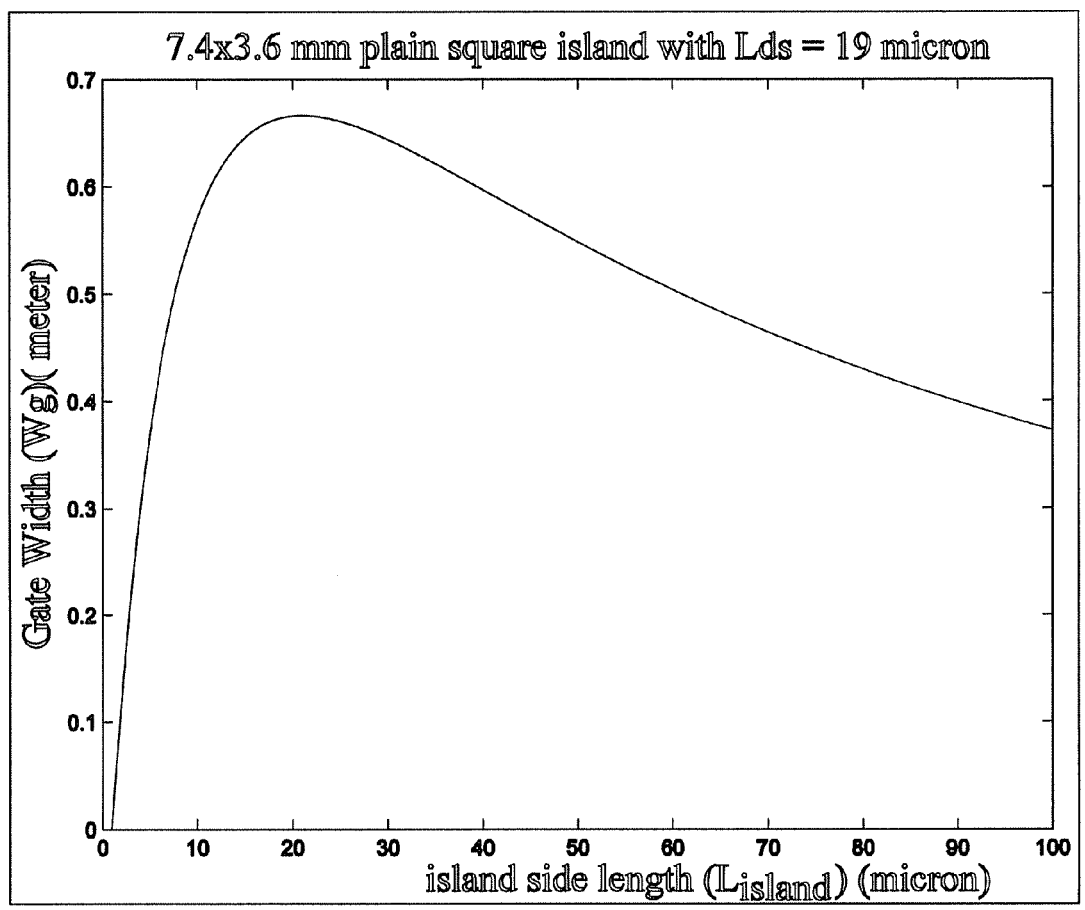
FIGS. 7A to 7C are graphs of gate width versus square island electrode length at a fixed source to drain spacing.
Figure 7B:
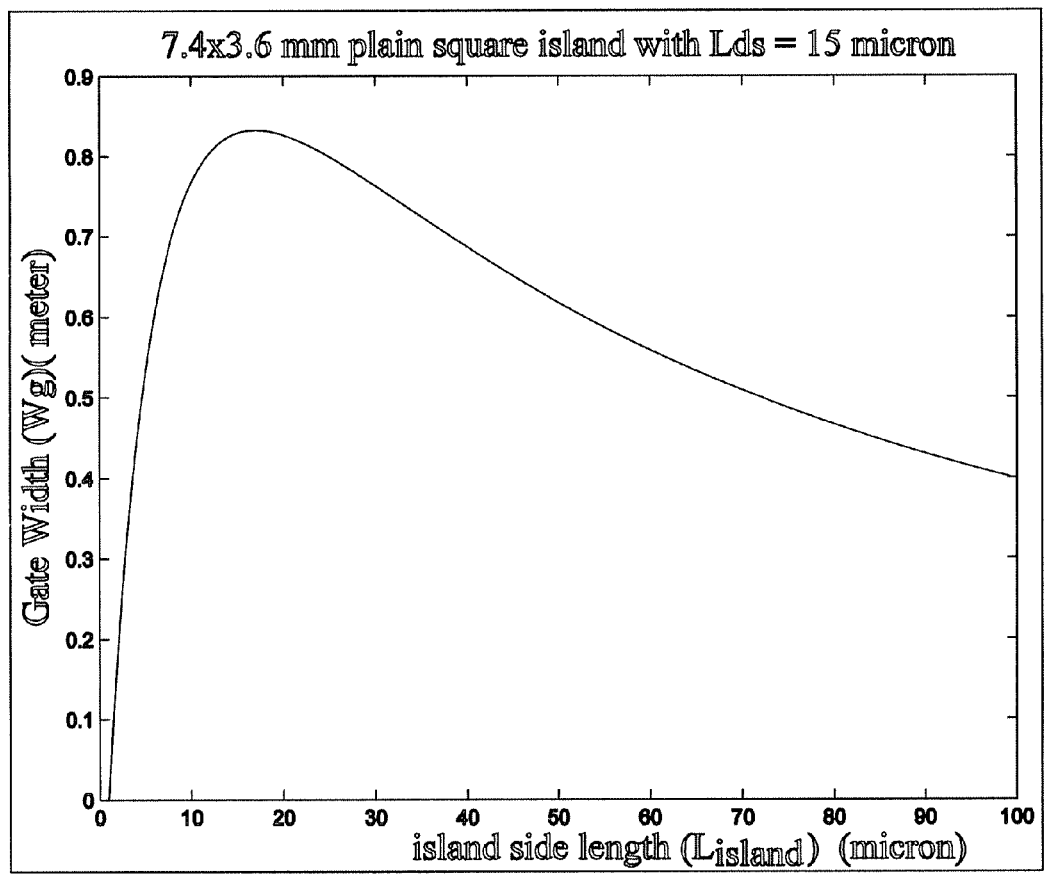
Figure 7C:
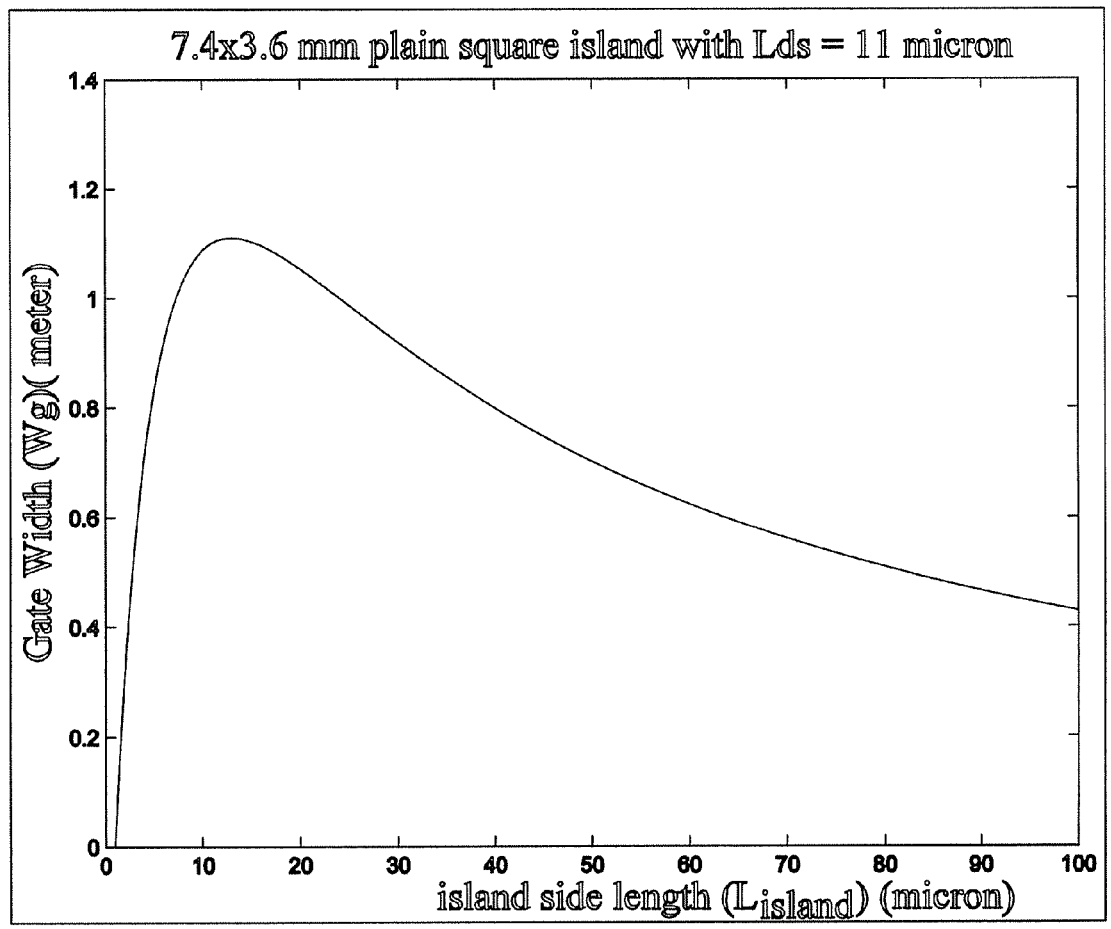

The inventors have also recognised that, surprisingly, the arrangement of electrodes provides a simple graphical design method for determining the optimal square island length $L_{island}$ based on the source to drain spacing Lds. FIGS. 7A to 7C illustrate the relationship between the gate width Wg of a gallium nitride transistor using a square island topography for a given source to drain spacing Lds. The gate width Wg is the aggregate of the gate electrodes 110 that are in a direction parallel to the sides of, and in between the electrodes 100, 105. As shown in FIGS. 7A to 7C, the optimal source/drain island length $L_{island}$ of a square island electrode to maximize the gate width Wg is approximately equal to the source to drain spacing Lds. More generally, the island length $L_{island}$ should be between 75% and 125% of the source to drain spacing Lds, preferably between 90% and 110% and more preferably, equal to the source to drain spacing. This relationship between island length $L_{island}$, source to drain spacing Lds and gate width Wg is very beneficial to optimise nitride semiconductor devices using the island topography. The gate width Wg of a transistor is a key parameter that determines the on-resistance and it is often desired to increase or maximize the gate width Wg. For example, leaving aside issues related to process design rule restrictions, the island length can be chosen based on the source to drain spacing which is primarily based on the breakdown voltage required, thus simplifying the design of the gallium nitride transistor. The graphical design method can also be used to determine the source to drain spacing Lds given an island length $L_{island}$.

Figure 8:
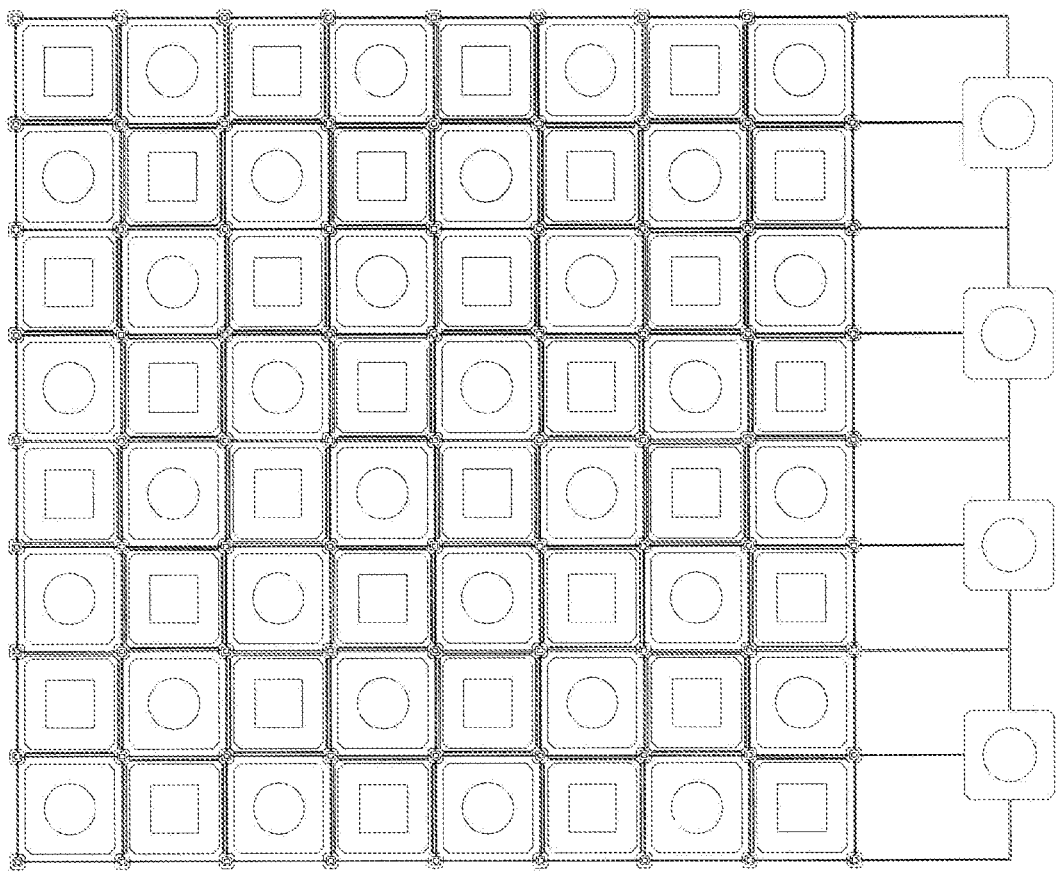
FIG. 8 is a plan view of a nitride semiconductor transistor having an island topography layout using square island electrodes aligned orthogonally.

FIGS. 7A to 7C apply to a series of devices that are aimed to have rated breakdown voltages ranging from 600 V to 1,700 V. The graphs are drawn for a device 10 having an overall nominal size of 3.6 mm×7.4 mm. In FIG. 7C for example, an island length of 43 microns can achieve a gate width of 700 mm. This gate width is more than double what can be achieved by a conventional finger design of the same device size. Doubling the gate width provides the benefit of reducing the device on-resistance by half. The ability to provide the gate current through straps 175 and post 106 by virtue of the island topography also provides the benefit of scaling, as shown in FIG. 8, without the issues that apply to conventional finger structures. The island topography allows use of the posts and does not have attendant large, high current tracks that need to be scaled to each current specification.

This island topography greatly increases the gate width for a given active area because the gate runs in multiple directions. As a result, the on resistance can be substantially reduced.

The island topography allows for the spaces between active devices to be used for connection points to the gate electrode 110. The gate strap 175 is made from a low resistance metal to reduce or eliminate the problem of metal gate resistance. The gate strap 175 can also be placed to act as an auxiliary field plate by positioning it above and offset from the gate electrode 110 as it transits the active gate-drain channel area.

The provision of the connections through gate contacts 106 also allows selective connections between the gate strap 175 and the gate corners of good functional individual cells. Gallium nitride has a different crystal structure than silicon and when a gallium nitride structure is faulted on silicon substrates, dislocations may result. Defects and dislocations that are in the vicinity of an active region can greatly impair device performance. By providing the ability to selectively connect to active areas through the straps 175, the nitride semiconductor device can electrically isolate defective active areas and remove them from the main structure. The gate connection and/or the drain connection of the defective device can be disconnected. For example, in a normally-off transistor, it may be sufficient to just disconnect the gate electrode. The disconnection mechanism could be based on a fuse or laser methodology. Due to leakage currents or capacitive coupling involved, it may also be necessary to ground a non-functional gate electrode to the source electrode. A metal-to-metal short circuit can be achieved with a high-energy laser. The strap 175 continues to connect the remaining gate electrodes 110. A yield improvement is also possible by isolating individual drains by gold bump removal or absence. Even in the presence of large defect densities it is therefore possible to produce viable functional devices using the island topography.

A layer of oxide 170 is provided over the gap 162 to support gate strap 175. The layer of oxide 170 can be silicon oxide and the gap 162 can be silicon nitride. A gate strap 175 is deposited on top of the oxide layer 170.

Figure 4:
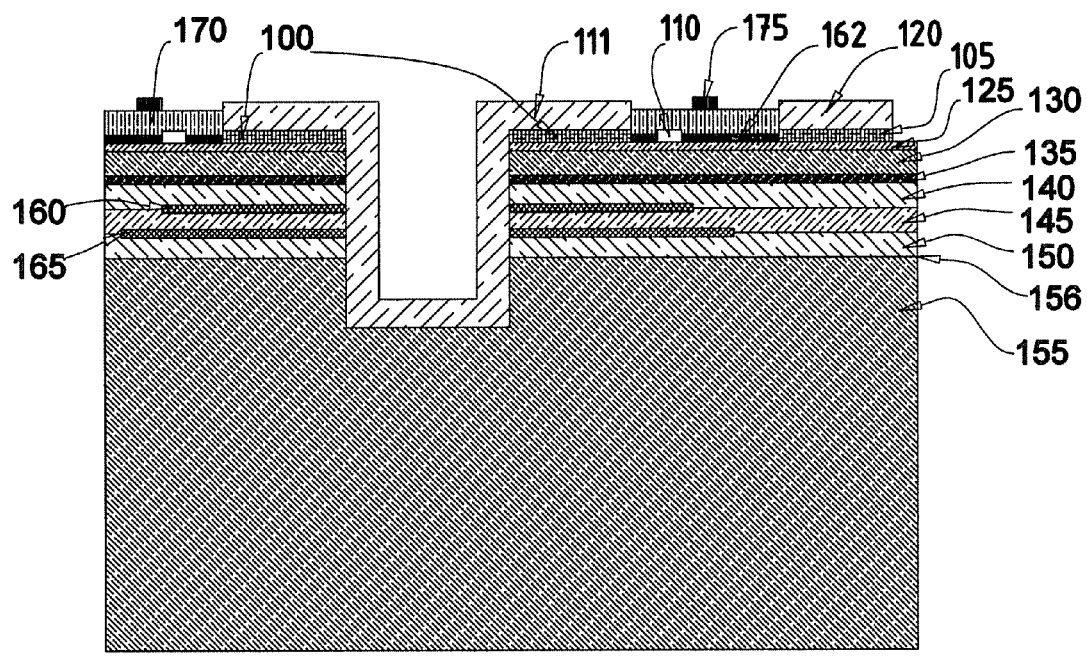
FIG. 4 is view on an enlarged scale on the line IV-IV of FIG. 1

As can be seen in FIG. 4, two field plates 160, 165 are inserted in between three epitaxial layers 150, 145, 140. It can be appreciated that the nitride semiconductor device can have none to multiple epitaxial layers and none to multiple conductive layers inserted between the epitaxial layers to act as buried field plates.

In cases where the base substrate 155 is heavily doped, small short vias 111 are able to provide a low resistance connection to the back of the substrate. The substrate doping level can be chosen to tailor the resistance to the particular needs of different types of transistor. Wafers that are heavily doped enable the formation of positive temperature coefficient resistors that operate reliably over temperature ranges extending to 600° K. For example, positive temperature coefficient can be chosen to be between 0.11% per ° K and 1.1% per ° K using wafer doping levels between 10E16 cm−3 and 10E18 cm−3. The short via 111 can be varied in length, depth and/or width to provide appropriate compensation.

Alternatively where very high temperature (higher than 600° K) and very high performance short term operation is required the resistor temperature coefficients can be chosen so that they reach as low as 10% of their room temperature value. Operation in this alternative mode will counteract the natural tendency of gallium nitride devices to reduce their performance at higher temperatures. Transition temperatures from positive to negative temperature coefficients can be chosen between 600° K and 900° K. While this negative temperature coefficient of resistance is not generally valuable, it is possible to use gold or another suitable dopant to achieve a negative temperature coefficient.

The structure and layout may thus be used to provide a series source resistance that has a negative temperature coefficient. As a result, the island topography can be used to build a gallium nitride transistor that exhibits very stable performance over a wide temperature range from below 300° K to over 600° K. Extremely simple bias methods and very stable, linear performance may be obtained. The device design difficulty centers around the problem of balancing the positive effects of the source resistance reduction versus the declining performance intrinsic to the gallium nitride transistors as the temperature increases.

Heavily doped substrates have disadvantages associated with the drain-source and channel-source capacitance. This higher capacitance arises from the fact that the substrate acts as one plate of a capacitor. A significant speed advantage arises from the reduced drain to substrate capacitance. The cut-off frequency ($f_t$) can be more than doubled because off the extra distance gained between the drain electrode and the substrate. To obviate the effects of higher capacitance, a very lightly doped substrate has been used typically. However, some semiconductor devices require a heavily doped bulk substrate.

To reduce the capacitance effect, the vertical structure of the island topography may include a very lightly doped epitaxial layer or a series of epitaxial layers grown upon the substrate in such a way that an idealized interfacial structure is maintained. Since subsequent process steps involve difficulties related to the differences in terms of lattice constant (17%) and expansion coefficient between gallium nitride and silicon, the process steps involving the epitaxial layer(s) can be very important.

Alternatively, a strained layer super lattice is provided to assist with the further growth of GaN/AlGaN heterolayers. High quality GaN/AlGaN heterolayers can be grown over the epitaxial layer(s) by inserting a GaN AlN super lattice over an AlN buffer layer directly grown on the epitaxial layer(s). The epitaxial layer(s) can be grown to extend, for example, over a thickness range of 3 to 20 microns. As a further example, when microwave transistors are fabricated, smaller capacitance may be preferred since it can be chosen to be part of the required matching network. However, this will require the capacitance to be a minimum and consequently, require a thicker epitaxial layer.

The vertical structure shown in FIG. 4 has buried field plates 160, 165 within the epitaxial layers 150, 145, 140. In another embodiment, one or more buried field plates of various sizes and shapes can be used to reduce the peak electric field near the gate edge that is juxtaposed to the drain and therefore increasing the maximum voltage that the transistor can withstand.

To reduce the electric field stress at the gate edge, it has become common practice to extend the drain side of the gate edge over the SiN or other surface passivation. For example, in some realizations, devices with a drain-gate spacing of 2.5 micron have a surface field plate extended 1.0 micron from the gate toward the drain. However, this extension results in an unwanted increase in gate-drain feedback capacitance and noticeably reduces the gain of the device. Alternative schemes involve a metal field plate connected to the source and placed over the gate.

As shown in FIG. 4, the nitride semiconductor device 10 employs source connected buried field plates 160, 165 that extends below the gate to the gate edge (or beyond) facing the drain, to serve as a buried field plate. The buried field plates 160, 165 are conductive in nature and can be formed of a dopant of silicon. Further gains in field stress reduction arise from the conductive substrate below the epitaxial layer. Each or any of the epitaxial layers, where several are used, may contain a buried layer acting as a buried field plate below the gate. The combination of a buried field plate and the conductive substrate can obviate the need for metal surface mounted field plates. Furthermore, the combination of surface field plates and buried field plates can be used to provide a very high breakdown voltage device. The field stress reduction leads to improved electrical performance characteristics including increased operation voltage and/or reduced gate leakage current. In addition, these buried field plates can be arranged to provide a very even distribution of the electrical stress between the gate edge and the drain edge such that an exceptionally linear device can be constructed. The vertical epitaxial silicon based structure can also assist with problems related to the mechanical stresses that arise due the disparity between the thermal expansion of silicon and gallium nitride.

It can be appreciated that a buried field plate may not be used, for example, in cases where the epitaxial layer is thin or a simplified process is desired. Furthermore, a trade-off can be made between reducing drain-source capacitance or reducing the field stress, resulting in an ideal epitaxial thickness for each transistor application.

Figure 9:
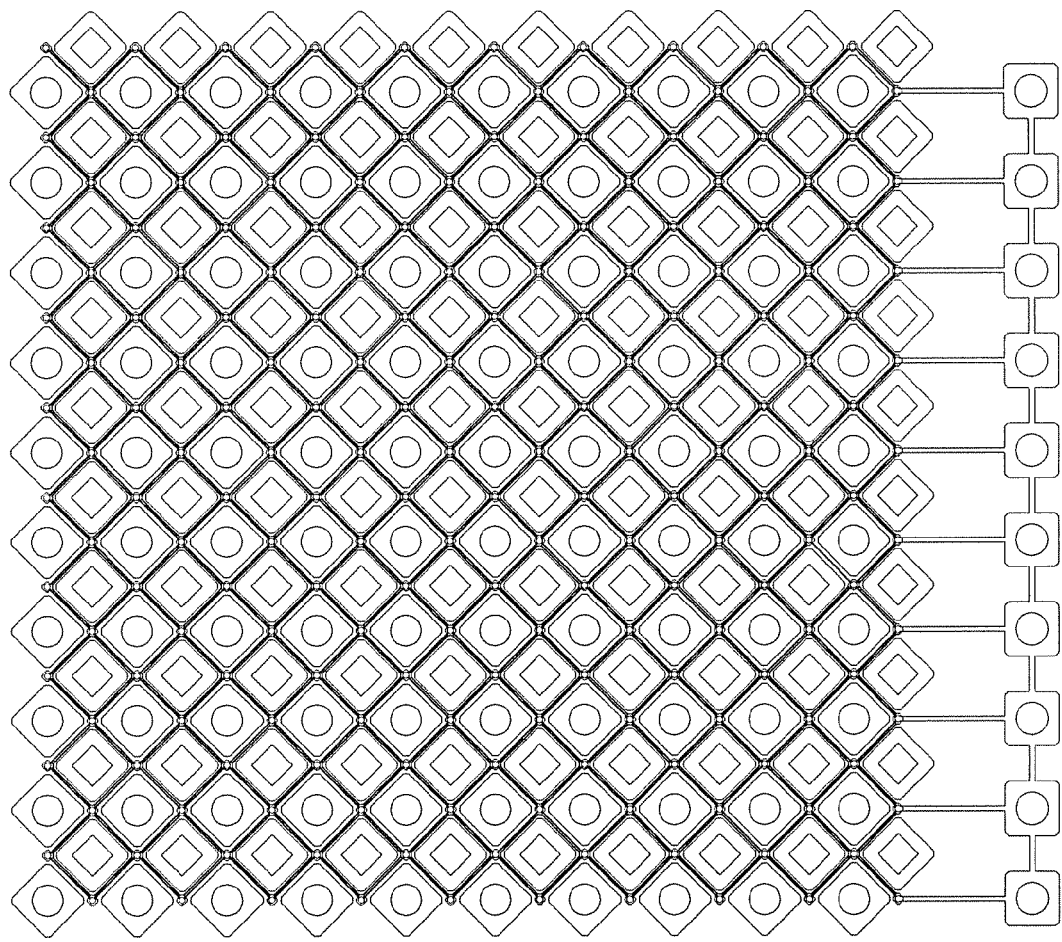
FIG. 9 is a plan view of a nitride semiconductor transistor having an island topography layout using square island electrodes aligned diagonally.

The arrangements shown in FIGS. 1 and 8 have the gate straps aligned with the sides of the electrodes 100, 105 for an orthogonal array. In another embodiment, the island topography can be arranged such that the square or rectangular shaped electrodes are diagonally aligned, as shown in FIG. 9.

The two-dimensional tiled layouts of the island topography provide the advantage of increased gate width by allowing the gate to run in both directions. The active useful gate width is not however doubled since some active area is lost in the transition between individual island devices. In practice, compared with multifinger device layouts, the island topographies of FIGS. 8 and 9 have been found to provide 1.5 to 4 times the gate width, with the on-resistance proportionately lowered.

Figure 10:
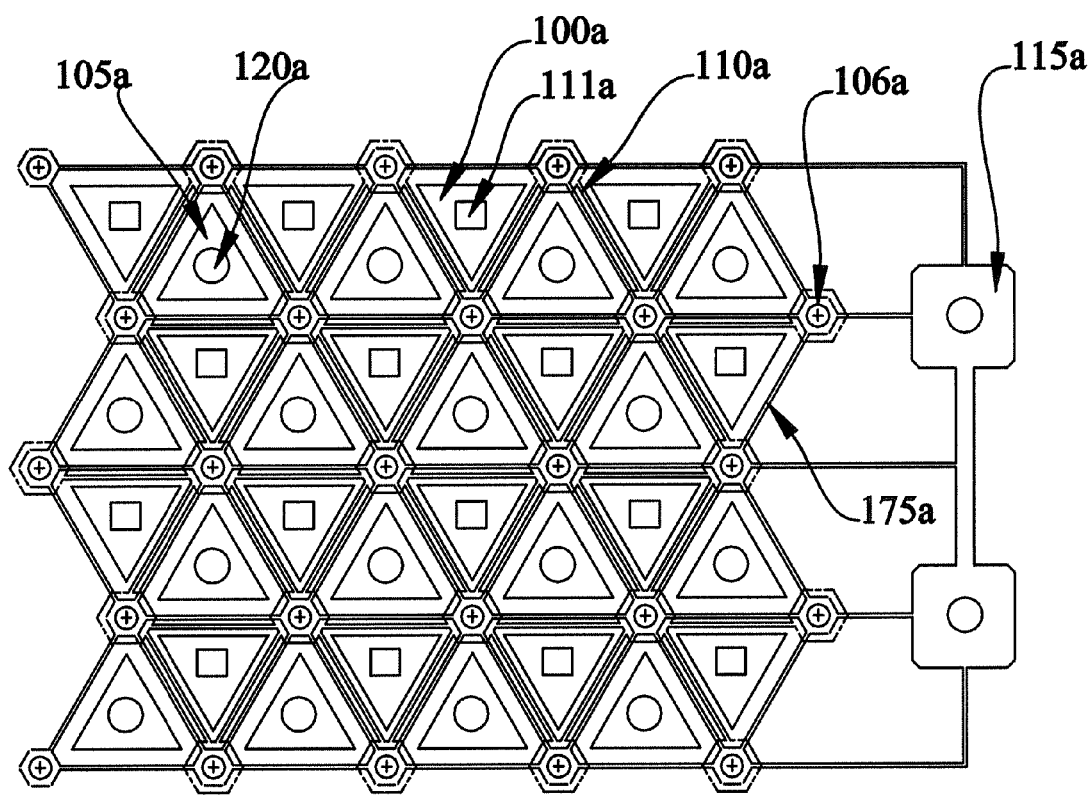
FIG. 10 is a plan view of a nitride semiconductor transistor having an island topography layout using triangle island electrodes.

In another embodiment, the gate width is enhanced by running the gate electrode in three directions which is made possible by using triangle shaped source and drain island electrodes. This is shown in the example island layout of FIG. 10 where an equilateral triangle island is used. A via 111a is placed on top of a triangle shaped source island electrode 100a. A ball connection 120a is placed on top a triangle shaped drain island electrode 105a. The fuse/anti-fuse or gate contact 106a joins a gate electrode 110a to a gate strap 175a. The gate strap 175a connects to a gate pad 115a. The source and drain island electrodes 100a, 105a are alternatively arranged such that each source island electrode is adjacent a drain island electrode at each side.

It can be appreciated that the island electrode can be any form of a triangle and is not restricted to equilateral triangles. In practice, this layout also provides approximately 1.5 to 4 times the gate width obtained by using conventional interdigitated or multi-fingered structures.

Figure 11:
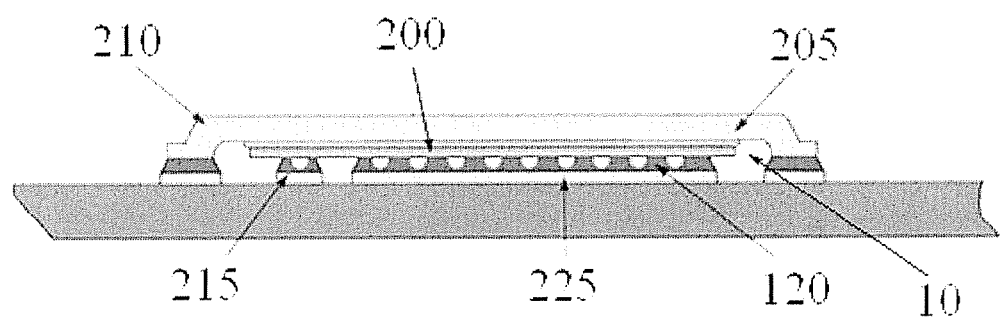
FIG. 11 is a cross-section view of a packaging of the nitride semiconductor transistor using the island topography.

Referring now to FIG. 11, a packaging of the nitride semiconductor device 10 using the island topography is shown in cross-section view. The absence of air bridges allows the dice 200 of the device 10 to be eutectically bonded (via a eutectic bond 205) to a copper/source heatsink clip 210. This can be inverted to allow the gate gold bumps 215 (connected to the gate pads 115) and drain gold bumps 120 to be connected directly to copper tracks 225 on a multi-chip assembly. This arrangement greatly reduces the overall area of the mounted device 10 compared to packages that use wire bonds and reduces the inductance of the drain and source connections.

In another embodiment of the packaging, all of the heat dissipation can be removed through the copper track on board, and the copper/source heatsink clip removed. To achieve this result, the drain, source and gate connections are all made of gold bumps and an insulative high resistance substrate is used.

The dice of the packaged device shown in FIG. 11 can also be thinned, for example to 50 microns, to achieve lower series resistance to the source connection. For example, it is common practice to thin the wafers of power R.F. devices from about 450 microns to 150 microns to lower the thermal resistance. The package can be used to mechanically strengthen the dice and to ensure that a low inductance connection to the source is obtained.

Figure 12:
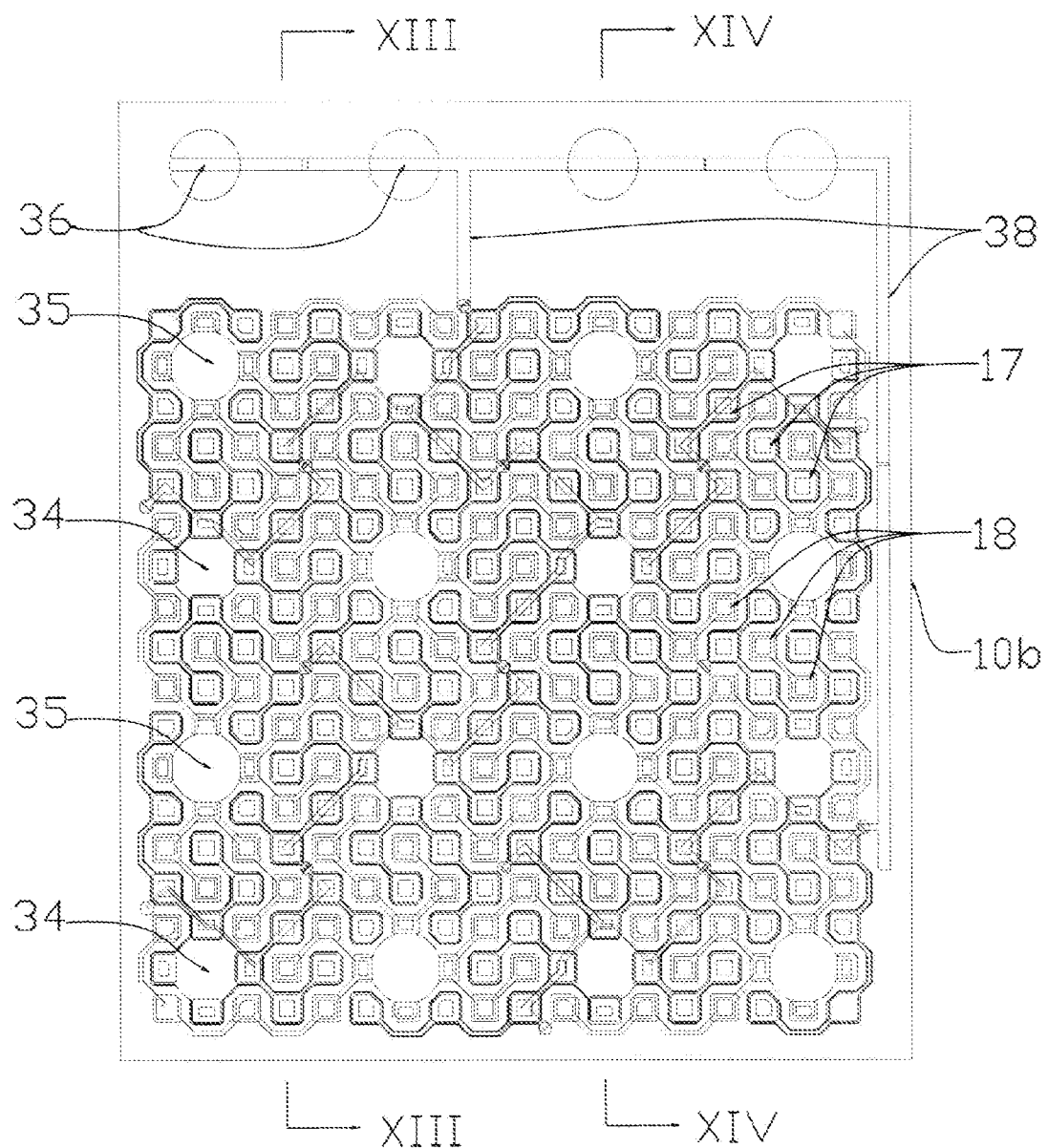
FIG. 12 is a plan view of a nitride semiconductor transistor having a square island topography with island clusters.

The arrangement of the island topography facilitates the implementation of commonly used devices. Referring to FIG. 12, another embodiment a nitride semiconductor device 10b is configured to provide a multi-island field effect transistor (FET).

Figure 13:
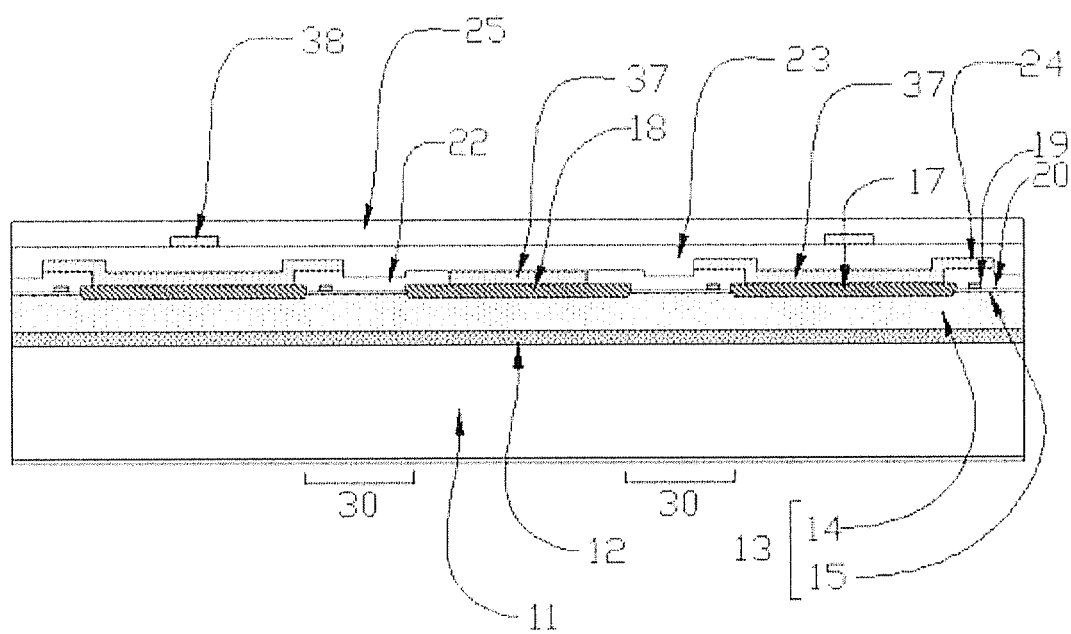
FIG. 13 is a cross-section view along the line XIII-XIII of FIG. 12.

As shown in FIGS. 12 and 13, the nitride semiconductor device 10b has a nitride semiconductor layer 13 formed on a non-conductive substrate 11 with a buffer layer 12 interposed between. The nitride semiconductor layer 13 is formed from an undoped gallium nitride (GaN) layer 14, for example having a thickness of 1 μm and an undoped aluminum gallium nitride (AlGaN) layer 15, for example having a thickness of 25 nm. The undoped GaN layer 14 and the undoped AlGaN layer 15 are sequentially formed over the buffer layer 12 in this order. A two-dimensional electron gas (2DEG) is generated in an interface region of the undoped GaN layer 14 with the undoped AlGaN layer 15, forming a channel region.

A silicon carbon (SiC) substrate may be used as the substrate 11 using an orientation that interfaces to the buffer layer 12 with the least lattice mismatch. However, the invention is not limited to SiC as a substrate, and any substrate may be used as long as the substrate is electrically non-conductive and a nitride semiconductor layer can be grown on the substrate.

A source island electrode 17 and a drain island electrode 18 are formed spaced apart from each other on the nitride semiconductor layer 13. In this embodiment, in order to reduce the contact resistance, the undoped AlGaN layer 15 and a part of the undoped GaN layer 14 are removed in the regions of the source electrode 17 and the drain electrode 18 so that the source electrode 17 and the drain electrode 18 reach a level lower than the interface between the undoped AlGaN layer 15 and the undoped GaN layer 14. The source electrode 17 and the drain electrode 18 can be formed from titanium (Ti) and aluminum (Al). A p-type AlGaN layer 20, for example having a thickness of 200 nm is formed in a stripe shape between the source electrode 17 and the drain electrode 18. A gate electrode 19 is formed on the p-type AlGaN layer 20. The gate electrode 19 can be formed from palladium (Pd).

In this embodiment, a region comprising a source electrode 17 and drain electrode 18 formed adjacent to each other, with a gate electrode 19 therebetween in the channel region of the nitride semiconductor layer 13, is referred to as an active interface area 30. Each source island electrode 17 and drain island electrode 18 have a plurality of active interface areas 30.

Figure 14:
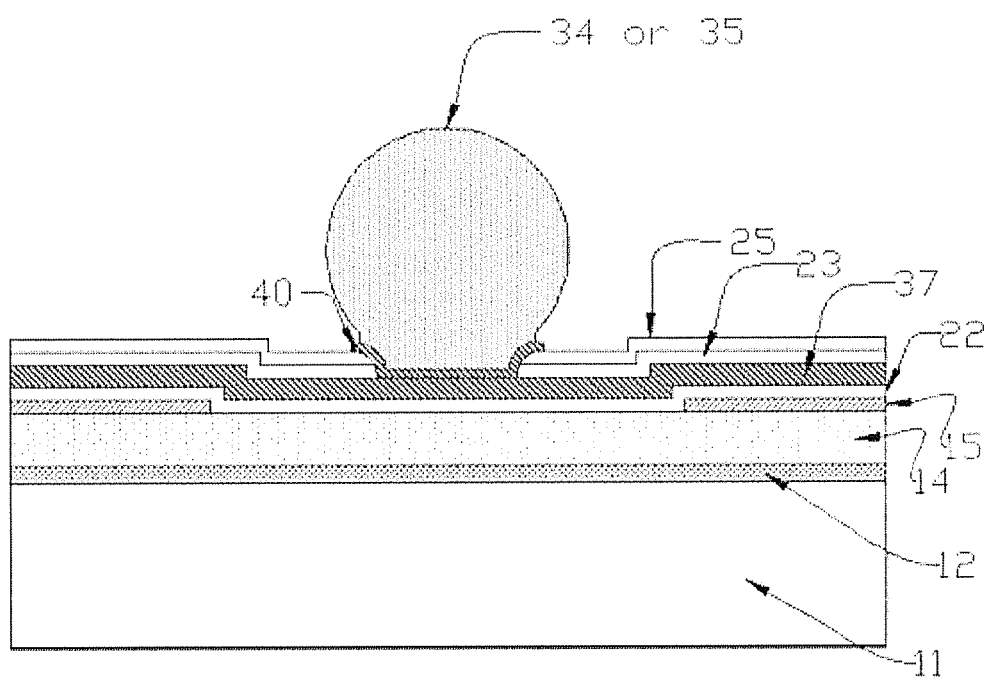
FIG. 14 is a cross-section view along the line XIV-XIV of FIG. 12.

As shown in FIGS. 13 and 14, a first insulating layer 22 is deposited on top of the gate electrode 19 and active interface areas 30 to provide for a raised source field plate 24 over the gate electrode 19 and to provide electrical insulation between the source electrode gold interconnection 37 and the gate electrode 19. The field plate 24 is formed during a gold interconnection metallization process that fauns the metallized tracks 37.

A second insulating layer 23 is deposited after the source and drain gold metallization tracks 37 have been formed, to provide insulation between the source gold tracks 37 and the gate gold tracks 38. Vias are etched out to permit electrical connections from the gate electrode 19 to the gate gold metallization tracks 38 at the gate electrode collection points 39 (FIG. 14).

Figure 15:
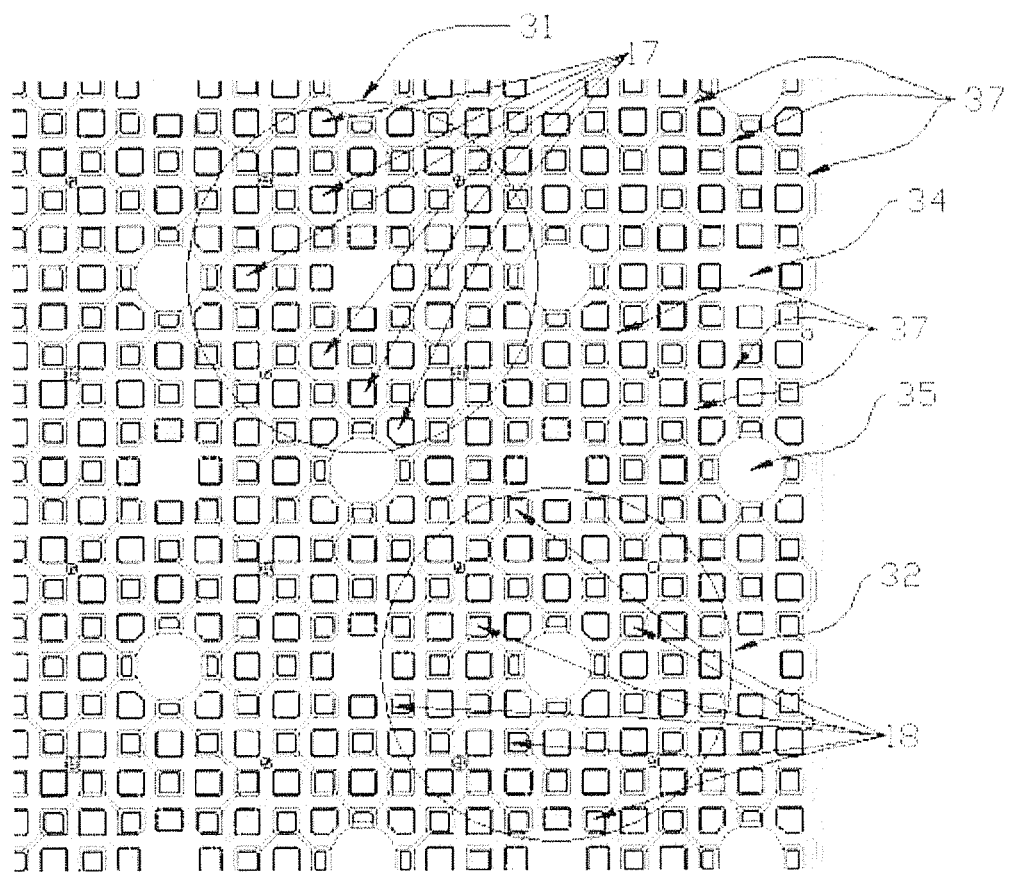
FIG. 15 is a plan view showing the source and drain clusters of the nitride semiconductor transistor of FIG. 12.

A third insulating layer 25 is deposited over the gate gold metallization tracks 38 to protect the die from oxidation. As shown in FIG. 14, via 40 is etched out of the third insulating layer 25 at all source, drain and gate gold bumps to permit electrical connections from the gold metalized tracks 37, 38 to the source, drain and gate gold bumps 34, 35, 36 (FIG. 15). The first, second and third insulating layers 22, 23 and 25 can be formed from silicon nitride (SiN), for example having a thickness of 50-300 nm.

As shown in FIG. 15, a plurality of source island electrodes 17 are electrically connected by their respective metal tracks 37 to each other in clusters, for example of 1 to 50 islands, to form a source cluster 31 with a common electrical interconnection point formed with a source gold bump 34. A plurality of drain island electrodes 18 are electrically connected by their respective metal tracks 37 to each other in clusters, for example of 1 to 50 islands, to form a drain cluster 32 with a common electrical interconnection point formed with a drain gold bump 35.

Figure 16:
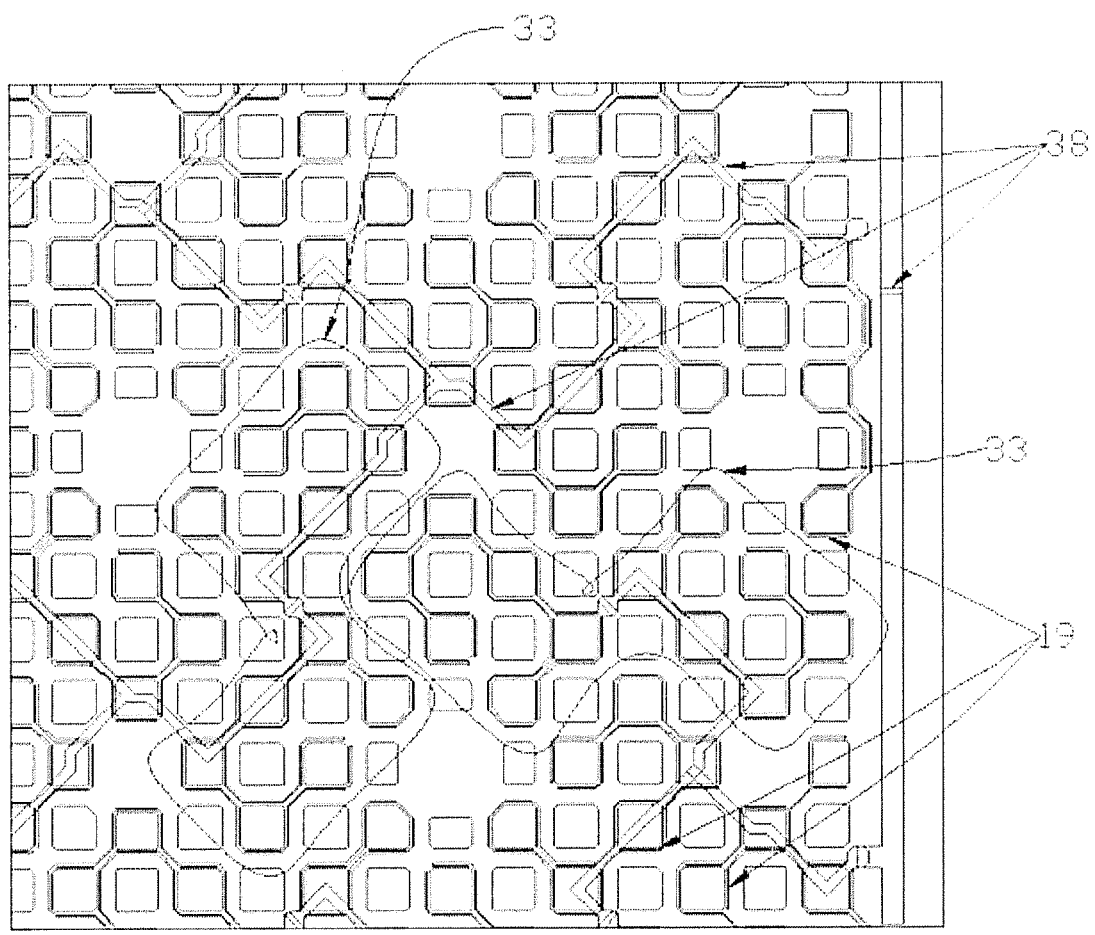
FIG. 16 is a plan view showing the gate clusters of the nitride semiconductor transistor of FIG. 12.
Figure 17:
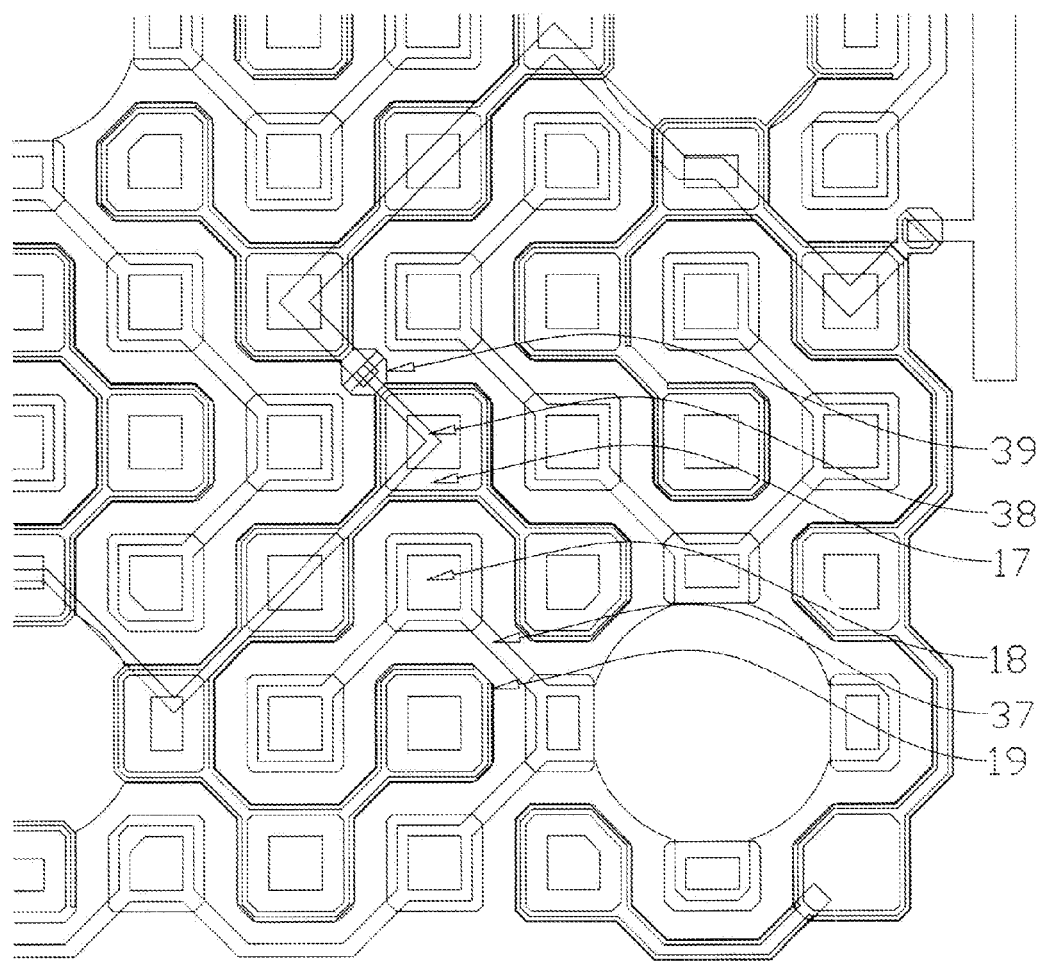
FIG. 17 is an expanded plan view of a portion of FIG. 16.

As shown in FIG. 16, a plurality of gate electrodes 19 are electrically connected to each other, for example in clusters of 1 to 50, to form gate cluster 33. Gate clusters 33 are electrically connected throughout the device by means of gold metalized tracks 38 which terminate at gate gold bumps 36 (FIG. 12). The gate gold metalized tracks 38 are vertically oriented above the source metal tracks which are at a similar voltage potential, thereby reducing a potential breakdown voltage problem between gate and drain tracks.

The source electrodes 17, drain electrodes 18, and gate electrodes 19 within the source clusters 31, drain clusters 32 and gate clusters 33 are alternatively arranged so that each drain electrode 18 is adjacent to a source electrode 17, with a gate electrode 19 in between.

The electrical connections between island electrodes of the same type are created by means of vias and gold metalized tracks 37, for example of 1 µm thickness and 3 to 4 µm widths, using one or a plurality of metallization layers and a lift off resist mask for each layer. The use of multiple metallization layers improves device fabrication yield and reduces metal lift off problems during the fabrication process.

The source gold bump 34, drain gold bump 35 and gate gold bump 36 provide distributed electrical current collection points throughout the device for the drain, source and gate electrodes, thereby substantially reducing the voltage drop variations and electromigration problems found in other power electronic semiconductor devices. These electrical collection points also permit the use of standard gold thicknesses and conventional width tracks, therefore removing the need for the typical die area consuming wide collecting tracks and bonding pads, while still providing all interconnection points on a single device surface.

It can be appreciated that the tracks 37 and 38 are not limited to using metal for interconnect and could use other suitable material such as silicide/polysilicon to replace the metal interconnect and contact system allowing for a reduction of costs, current hogging, concentrated stresses and electromigration factors.

It can also be appreciated that the external interconnections are not limited to gold bumps and other suitable connection means can be used. For example, through-substrate vias can be used instead of the gold bumps for either the source or drain electrical connections in the FET, or for the cathode or anode electrical connections for the diode (described below). For devices which use through-substrate vias, an electrically conductive substrate can be used.

FIG. 14 shows a portion of the cross-section structure taken along line XIV-XIV in FIG. 12 to illustrate the vertical structure having the gold bump 34 or 35 connection. The present state of the art gold bump technology has spacing limitations that determine the minimum distance gold bumps can be located to each other on the device. Without this gold bump spacing limit, gold bumps could be placed on each island to eliminate the need for inter-island electrical connections provided by the gold metalized tracks 37, thereby maximizing the gate width per area. For example, based on available gold bump technology a feasible device would have clusters of typically 24 to 48 island electrodes per gold bump. Larger clusters could also be formed if even greater gold bump spacing is required.

The embodiment of FIG. 13 describes an enhancement mode FET. However, it can be appreciated that the principles equally apply to a depletion mode FET, for example, by not including the p-type AlGaN layer 20 in the fabrication process.

Figure 18:
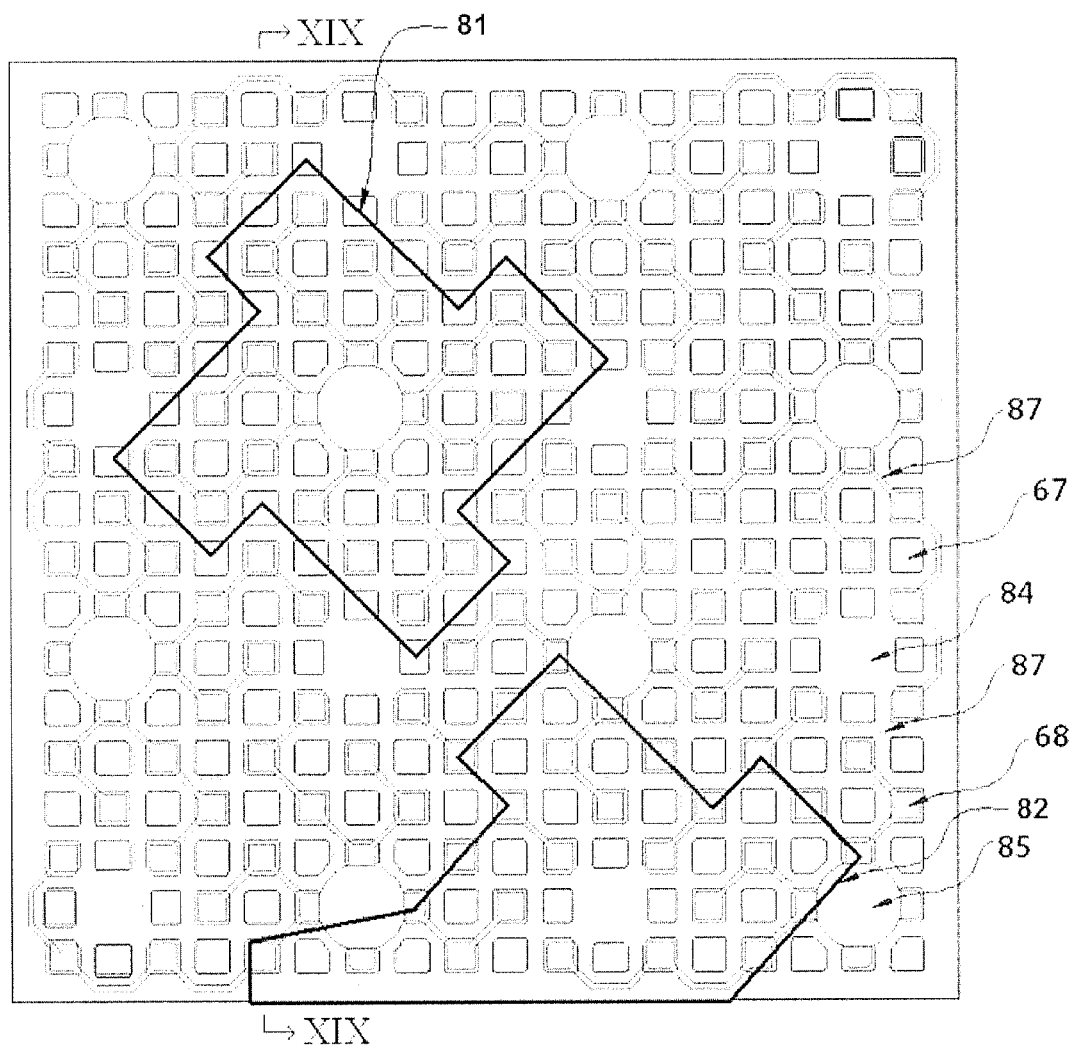
FIG. 18 is a plan view of a nitride semiconductor diode having a square island topography with island clusters.
Figure 19:
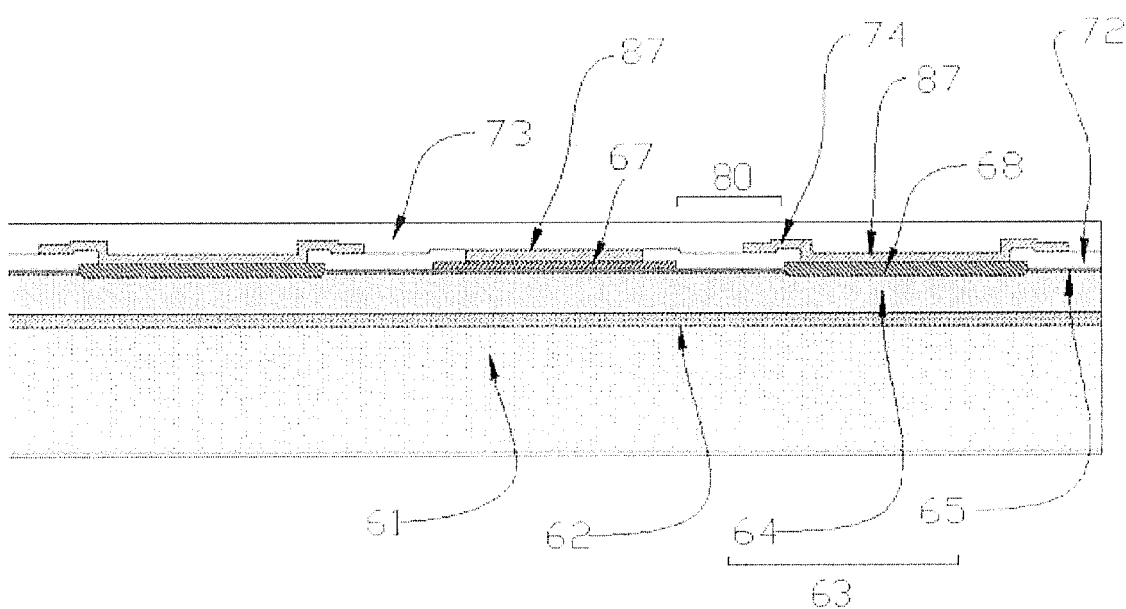
FIG. 19 is a cross-section view along the line XIX-XIX of FIG. 18.

FIG. 18 shows another embodiment of a nitride semiconductor device in the form of a multi-island diode. FIG. 19 shows a portion of the cross-section structure taken along line XIX-XIX of FIG. 18.

As shown in FIG. 19, the nitride semiconductor device of this embodiment has a nitride semiconductor layer 63 formed on an electrically non-conductive silicon (SiC) substrate 61 with a buffer layer 62 interposed therebetween. The nitride semiconductor layer 63 is formed from an undoped gallium nitride (GaN) layer 64, having for example a thickness of 1 µm, and an undoped aluminum gallium nitride (AlGaN) layer 65, having for example a thickness of 25 nm. The undoped GaN layer 64 and the undoped AlGaN layer 65 are sequentially formed over the buffer layer 62 in this order. A two-dimensional electron gas (2DEG) is generated in an interface region of the undoped GaN layer 64 with the undoped AlGaN layer 65.

A cathode electrode island 67 and an anode electrode island 68 are formed spaced apart from each other on the nitride semiconductor layer 63. The cathode electrode island 67 can be formed from titanium (Ti) and aluminum (Al) and reaches a level lower than the interface between the undoped AlGaN layer 65 and the undoped GaN layer 64. The anode electrode island 68 can be formed from palladium (Pd) and is in contact with the top surface of the undoped AlGaN layer 65. A region where a cathode electrode island 67 and anode electrode island 68 are formed adjacent to each other in the nitride semiconductor layer 63 is referred to as an active interface area 80.

A first insulating layer 72 is deposited on top of the active interface areas 80 to provide for a raised anode field plate 74. The field plate 74 is formed during the gold interconnection metallization process that forms the metallized tracks 87.

A second insulating layer 73 is formed on the device except in the areas where the cathode gold bumps 84 and the anode gold bumps 85 are to be placed. The second insulating layer 73 is provided to stabilize the surface of the device and can be formed from silicon nitride (SiN).

As shown in FIG. 18, a plurality of cathode island electrodes 67 are electrically connected, by means of gold metalized tracks 87, to each other in clusters, for example of 1 to 50 islands, to form a cathode cluster 81 with a common electrical interconnection point formed with a cathode gold bump 84. A plurality of anode island electrodes 68 are electrically connected, by means of gold metalized tracks 87, to each other in clusters, for example of 1 to 50 islands, to form an anode cluster 82 with a common electrical interconnection point formed with an anode gold bump 85.

The cathode electrodes 67 and anode electrodes 68 of the cathode clusters 81 and anode clusters 82 are alternatively arranged so that each cathode electrode 67 is adjacent to an anode electrode 68, thereby creating the maximum number of active interface areas 80.

Figure 20:
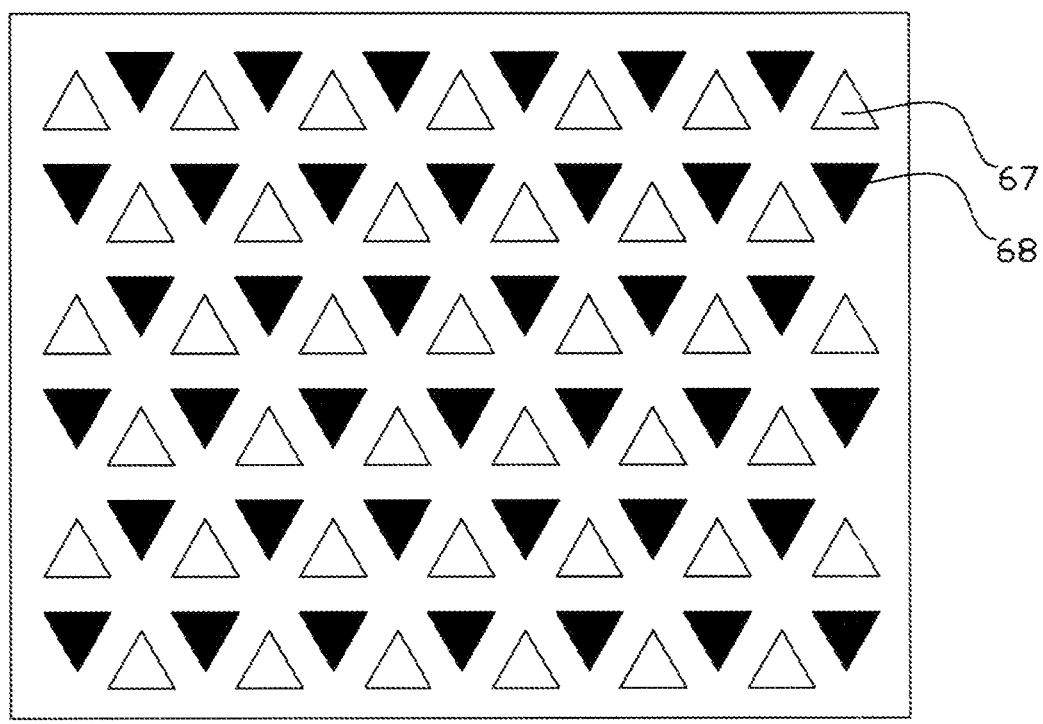
FIG. 20 is a plan view of a nitride semiconductor diode having a triangle island topography with island clusters.

It can be appreciated that triangular shaped island electrodes can be used for both the multi-island FET and multi-island diode embodiments. An example layout of a multi-island diode using triangular shaped island electrodes is shown in FIG. 20.

The electrical connections between island electrodes, the gold bump technology, through-substrate vias and substrate used in the multi-island FET embodiment are equally applicable to multi-island diodes. The island topography enables the multi-island diode to have a very large collective active interface between cathode and anode electrodes, whereby a high power device capable of high current operation can be implemented.

Figure 21:
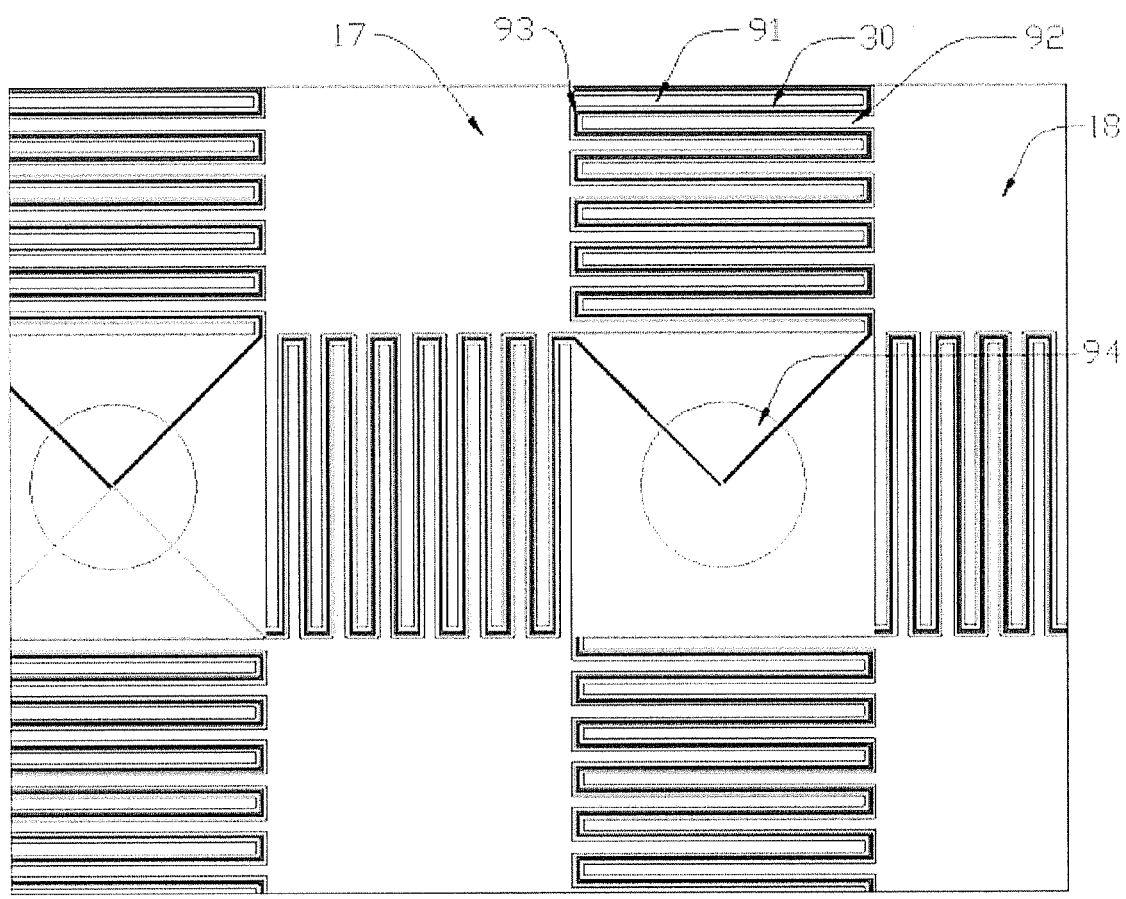
FIG. 21 is a plan view of a nitride semiconductor transistor having a castellated island topography.

In another embodiment, the island electrode of an island topography can be castellated (or crenulated). FIG. 21 shows a plan view of an island topography layout of a multi-island FET wherein the rectangular shaped island electrodes have been castellated. In this embodiment, the source island electrode 17 has castellated peninsulas 91 interleaved with the castellated peninsulas 92 from the drain island electrode 18 to increase the active interface area 30 between each type of electrode. Within these active interface areas 30 between the castellated peninsulas 91, 92, a third stripe shaped electrode 93 is deposited to form the gate electrode.

The castellated island topography of FIG. 21 is applicable to diode structures without the gate electrode between the island electrodes' castellated peninsulas. The castellated island topography is also applicable to triangular shaped island electrodes, either with or without gate electrodes, to create transistors or diodes.

The castellated peninsulas 91, 92 shown in rectangular shape in FIG. 21, can alternatively be of a tapered trapezoidal shape to improve the electromigration problems that pertain to high current applications. The castellated peninsulas 91, 92 can also have gold or other metal centered along them to increase their electrical current handling capabilities. Transistors made using the structure shown in FIG. 21 can provide two to three times lower on-resistance than the simple non-castellated island topography for practical low voltage semiconductor implementations using smaller electrode spacing.

The castellated island topography is well suited to flip-chip electrode electrical connections by using the gold bumps discussed previously. The plurality of gold or other conductive metal electrical connections 94 to the gate electrodes 93 at regular intervals, substantially improves the switching speed and switching delay time of the device.

Figure 22:
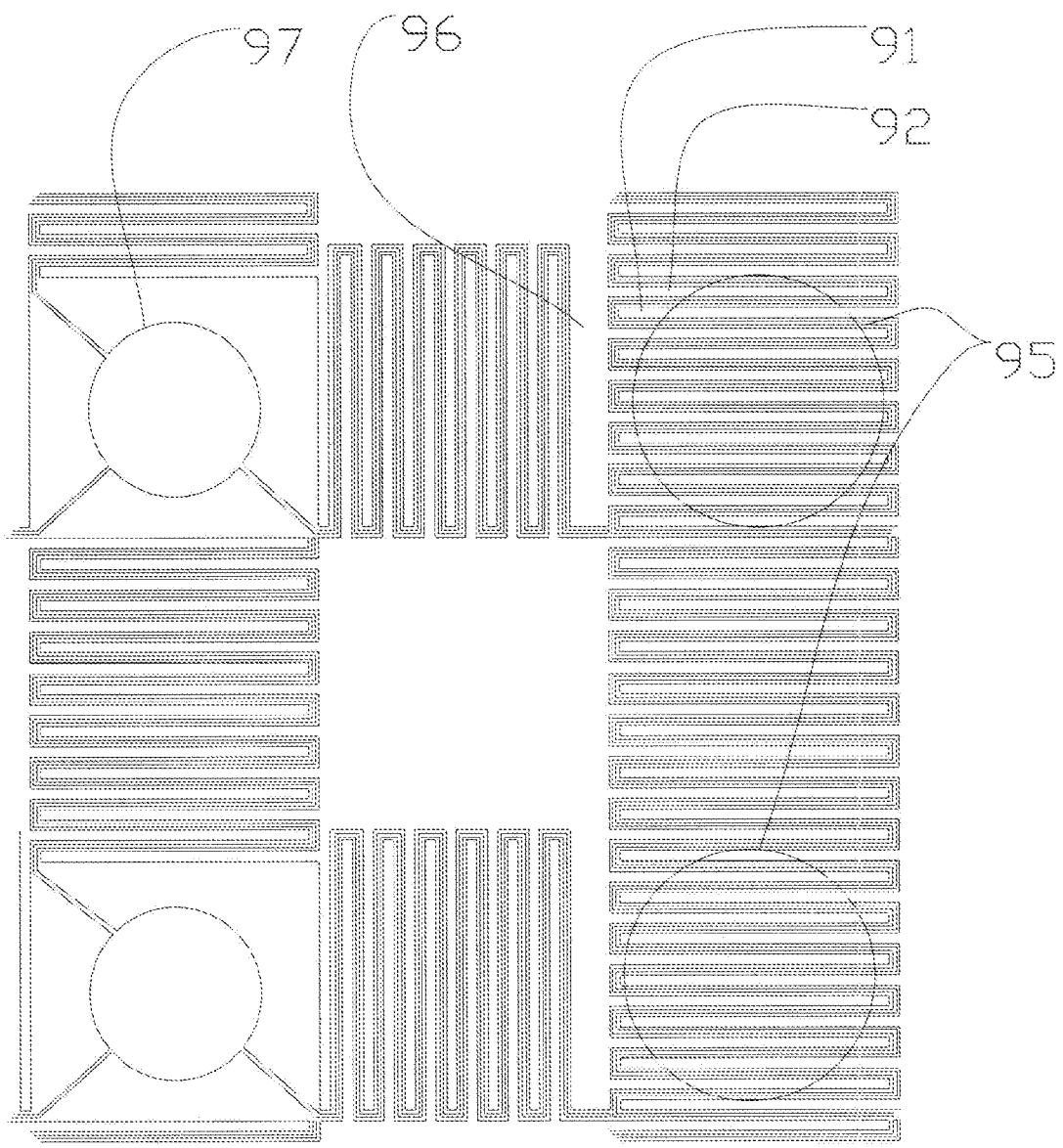
FIG. 22 is a plan view of a nitride semiconductor transistor having another embodiment of the castellated island topography.

In another embodiment, the castellated peninsulas can be extended into areas adjacent to the island electrodes. As shown in FIG. 22, a plurality of additional active interface areas 30 can be created by extending the castellated peninsulas into areas 95 adjacent to the island electrodes. This can increase the gate length and current handling capability of the device. Varying widths of peninsulas, such as peninsula 96, can also be created to handle the current from the additional interleaved peninsulas 91, 92. The resulting semiconductor devices can be formed with or without gate electrodes, to create transistors or diodes, respectively. In the diode application, or in cases where transistor gate speed is not critical, increased current handling capability can be achieved by using other non-active areas 97 for additional peninsulas if it is not required for gate connections.

Figure 23:
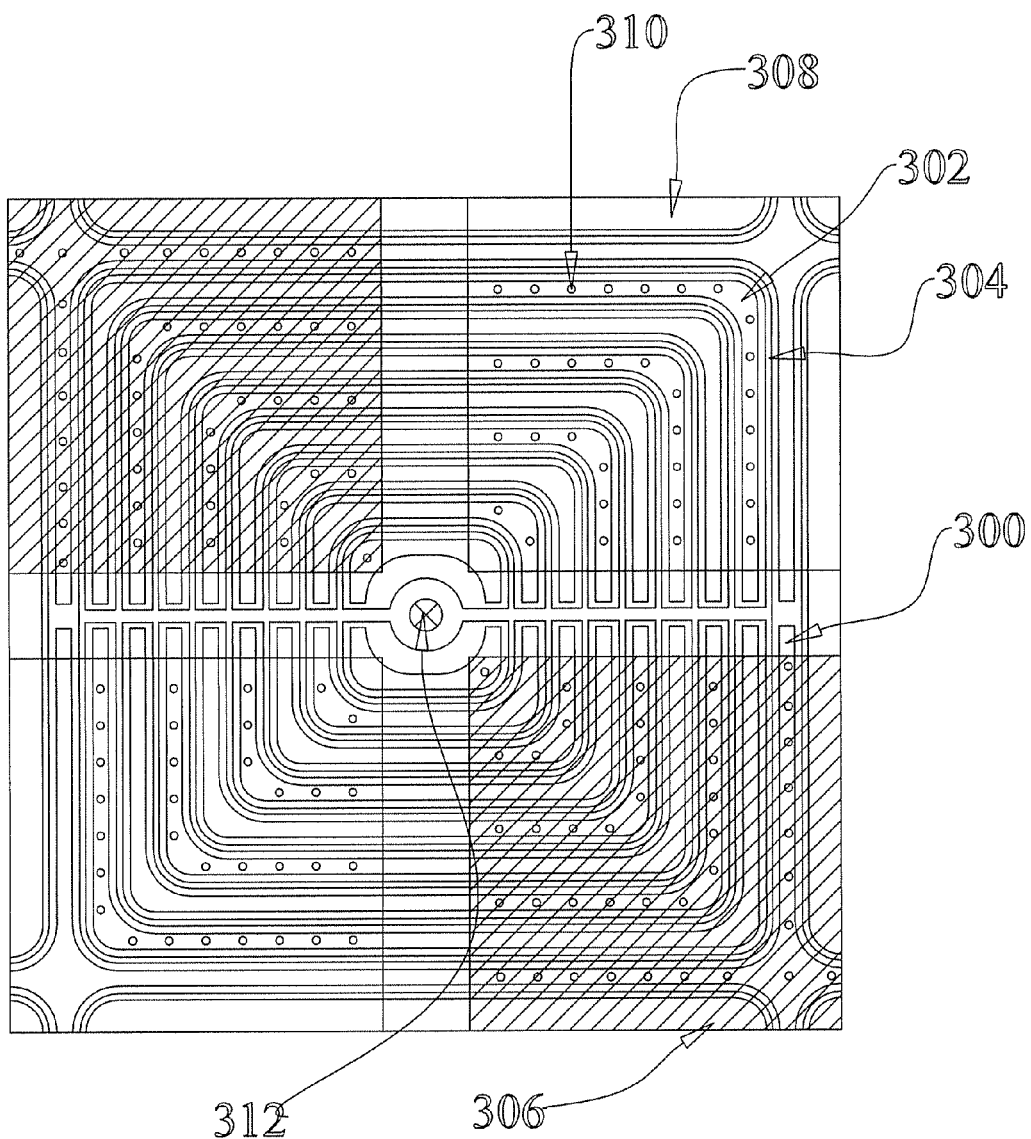
FIG. 23 is a plan view of a nitride semiconductor transistor having a concentric island topography.

In another embodiment, the source and drain island electrodes comprise of concentric electrode islands of decreasing size. In FIG. 23, a high electron mobility transistor (HEMT) transistor structure is provided having repeated square shaped concentric tracks of ohmic and Schottky contacts. Every two ohmic contacts with one Schottky contact in between, form a HEMT structure with the overall structure forming a concentric multi-island HEMT.

Figure 24:
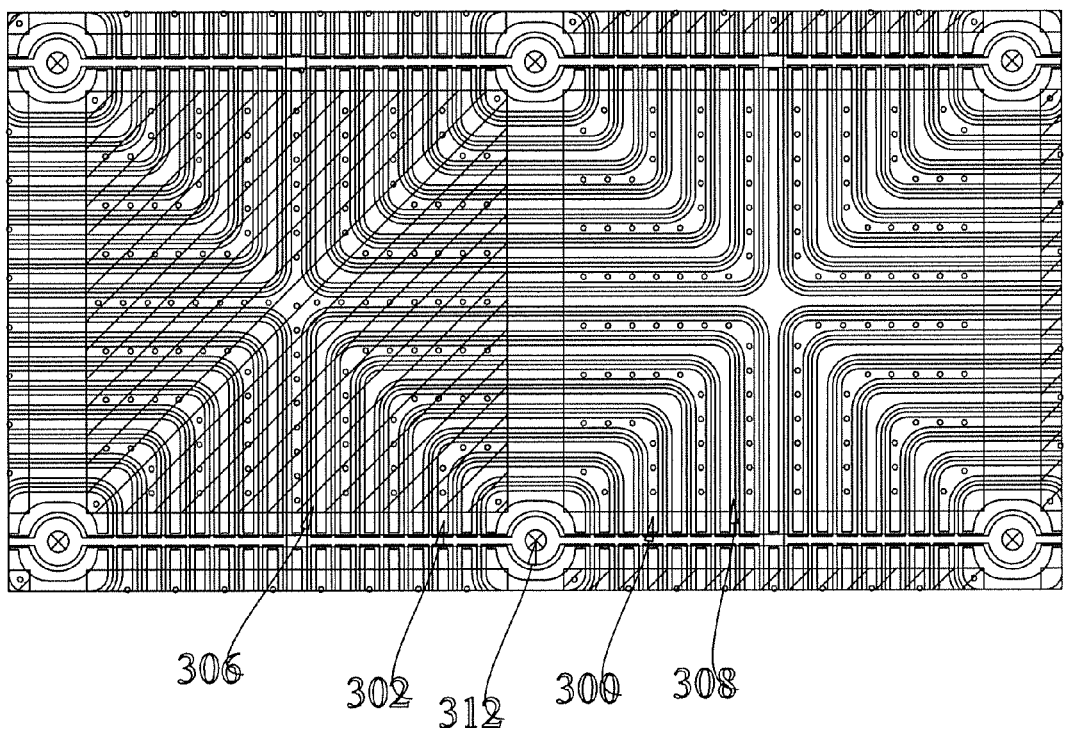
FIG. 24 is a plan view of a larger portion of the nitride semiconductor transistor of FIG. 23.

As shown in FIG. 23, the HEMT structure has a plurality of source concentric island electrodes 300 and drain concentric island electrodes 302 made from a portion of the ohmic concentric tracks. In between the source and drain concentric electrodes 300, 302 are gate electrodes 304 made from the Schottky contact. The source and drain concentric electrodes 300, 302 are alternatively arranged such that each source island electrode 300 is adjacent to a drain island electrode 302. The source island electrode 300 is connected to a source metal pad 306 by vias 310. The drain island electrode 302 is connected to a drain metal pad 308 by vias 310. In FIGS. 23 to 24, source metal pads 306 are shown hatched and drain metal pads 308 are shown solid. A gate connection point 312 is located at the centre of the set of concentric tracks and the gate connection point 312 is also aligned with the space defined with the corners of the source and drain metal pads 306, 308.

The source and drain concentric island electrodes 300, 302 can be accessed by source and drain island metal pads 306, 308 which are also alternatively arranged such that each source metal pad 306 is adjacent to a drain metal pad 308. In FIG. 23, the corners of four metal pads are placed over one set of square shaped concentric tracks of source and drain island electrodes 300, 302. In this embodiment, each source and drain island metal pad 306, 308 covers 4 corners of 4 different sets of concentric tracks (FIG. 24).

The island metal pads 306, 308 can be isolated from the underlying electrodes by a layer of oxide, nitride or other electrically insulative layer. Through this layer, a via 310 or other contact method can be used to allow a connection to be made from the metal island pad 306, 308 to the underlying drain or source concentric island electrodes 300, 302. A connection 310 is made only between drain electrodes 302 and drain pad 308 and only between source electrodes 300 and source pad 306.

The arrangement of FIG. 23 provides the benefit of requiring only one quarter of the HEMT device to provide conduction through the highly resistive ohmic contact metal making up the source and drain electrodes before reaching a source or drain metal pad. FIG. 24 illustrates the use of multiple sets of concentric tracks and the placement of each source metal pad 306 and drain metal pad 308 over one corner of each of the 4 sets of concentric tracks. As previously mentioned, the source and drain metal island pads themselves are alternatively arranged such that each source metal pad 306 is adjacent to a drain metal pad 308.

The Schottky gate electrode 304 is connected to an interconnect metal strap such as gold or aluminum to provide a low resistance at the gate contact 312 which is located in the spaces defined by the corners of the metal island pads 306, 308 to achieve a large contact area.

Figure 25:
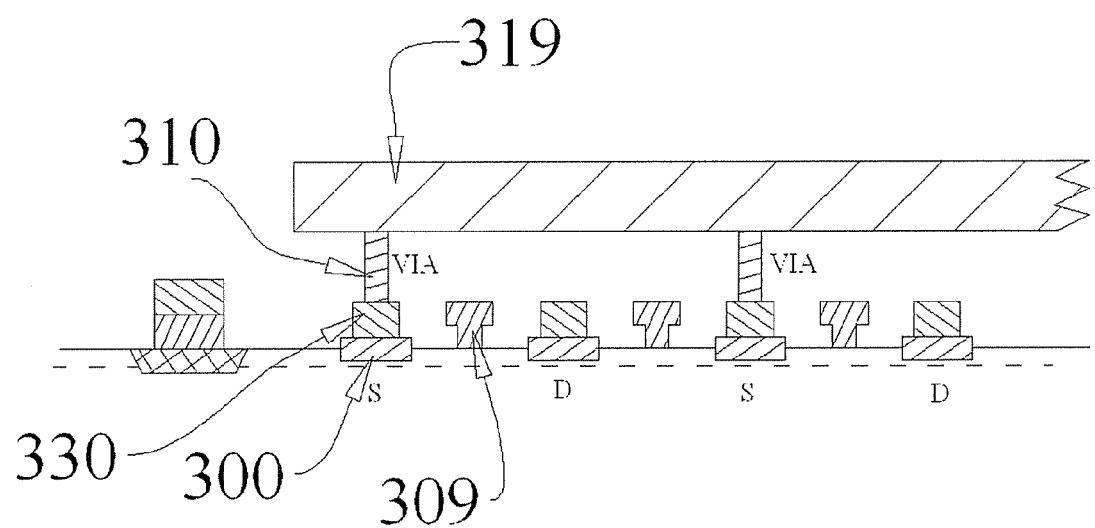
FIG. 25 is a cross-section view of a nitride semiconductor transistor having a concentric island topography.

A low resistance strap can be used with the highly resistive ohmic contact metal making up the source and drain electrodes 300, 302. The cross-section in FIG. 25 shows the source electrode 300 strapped to a low resistance interconnect metal 330. The low resistance interconnect 330 is connected to the metal source pad 306 by a via 310. The low resistance metal interconnect 330 helps prevent the scaling problem that severely impairs the performance of conventional high current power transistors because the on-chip local debiasing stand-off voltage produced by the transistor source connection series resistance (under high current conditions) prevents the transistor from being fully turned on. As a result, the input voltage does not appear in-full across the intrinsic active source/gate electrodes. The metal interconnect 330 addresses the problem by removing most of the voltage drop that appears in series with the intrinsic source electrode. A low resistance metal interconnect can also be used on the drain electrode as shown in FIG. 25.

The example device of FIG. 25 also uses a T-shaped gate electrode 309 to provide a lower series resistance and provides a surface field plate effect. It can be appreciated that additional field plates connected to the source or gate can be used.

Figure 26:
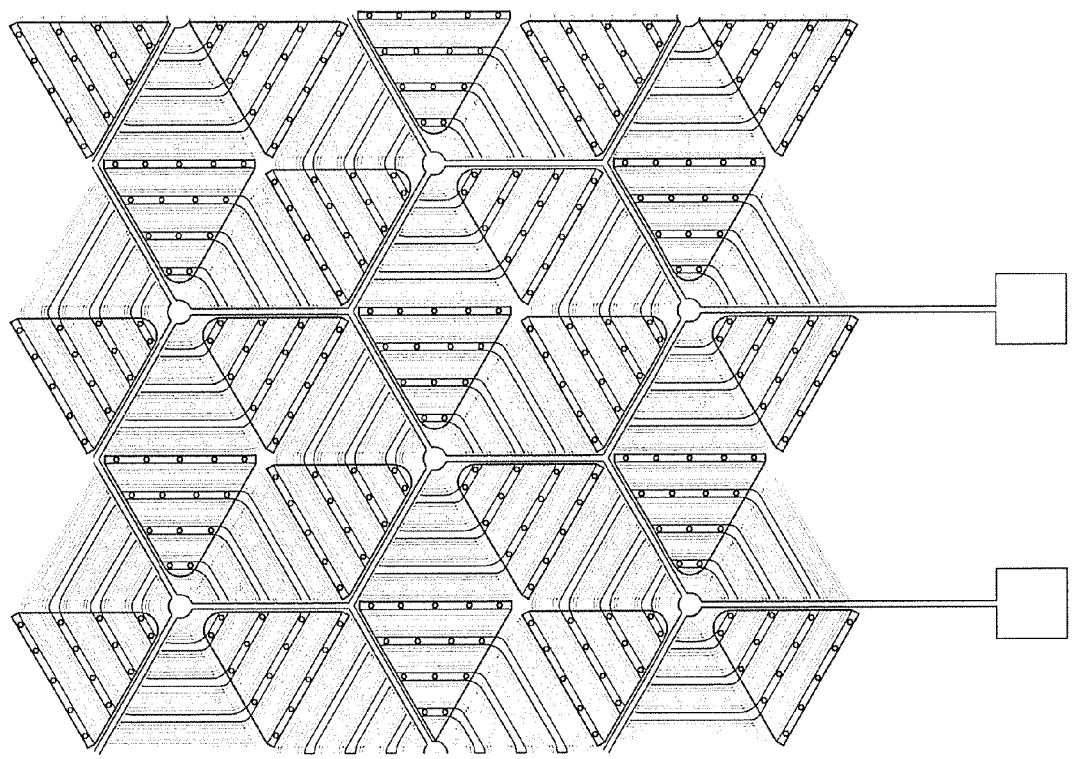
FIG. 26 is a plan view of a nitride semiconductor transistor having a concentric island topography using hexagon electrode tracks and triangle island metal pads.

In another embodiment shown in FIG. 26, the concentric electrode elements can be arranged in hexagon shaped tracks such that the source and drain metal pads can be triangle shaped and placed in an alternating island topography. There is no requirement for the rectangular or triangular islands pads to be symmetrical.

It can be appreciated that the concentric island and island pad arrangements can equally apply to diodes with the removal of the gate structures. This island topography can be applied to transistors and diodes in both low voltage and high voltage applications.

Figure 27:
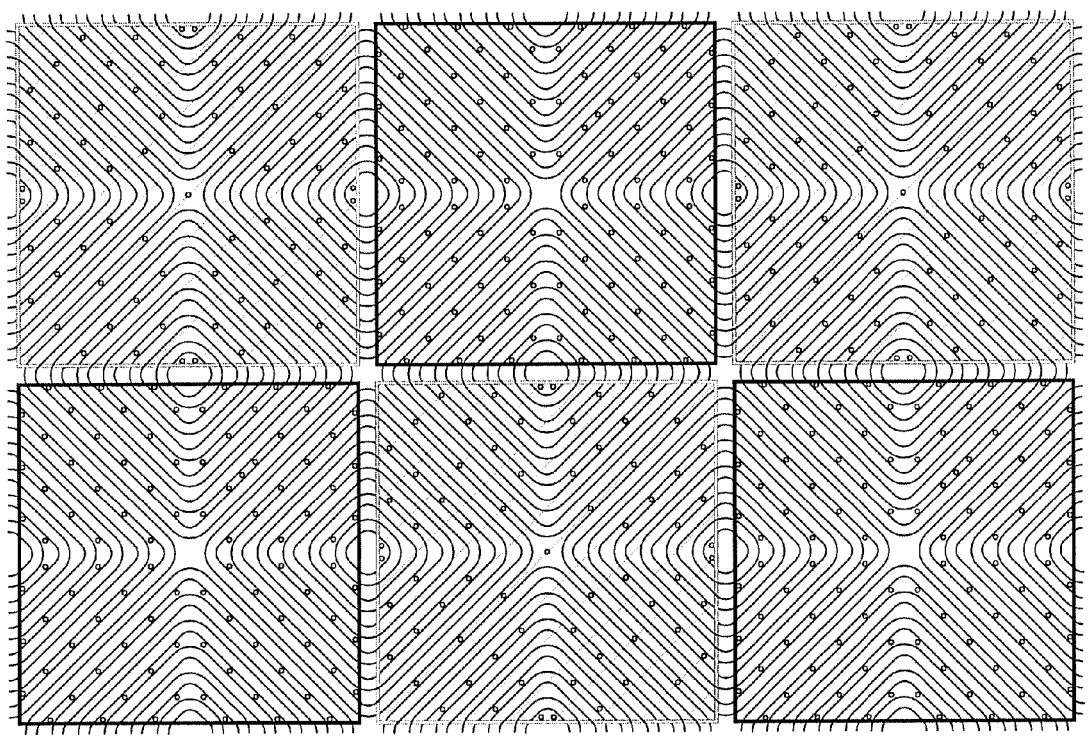
FIG. 27 is a plan view of a nitride semiconductor diode having another embodiment of a concentric island topography

FIG. 27 illustrates an example use of the concentric island structure to provide a high density diode matrix layout. The absence of the gate electrode further simplifies the structure allowing a higher density to be achieved. In the example layout of FIG. 27, the concentric square cathode and anode electrodes are centered between the metal island pad edges (in contrast to the embodiment of FIG. 23 where the concentric electrodes were centered at the corners of the pads). The embodiment shown in FIG. 27 allows the cathode and anode islands electrodes to be easily sized to accept very large island pads which allow large connection posts to be mounted upon the cathode and anode island electrodes.

Figure 28:
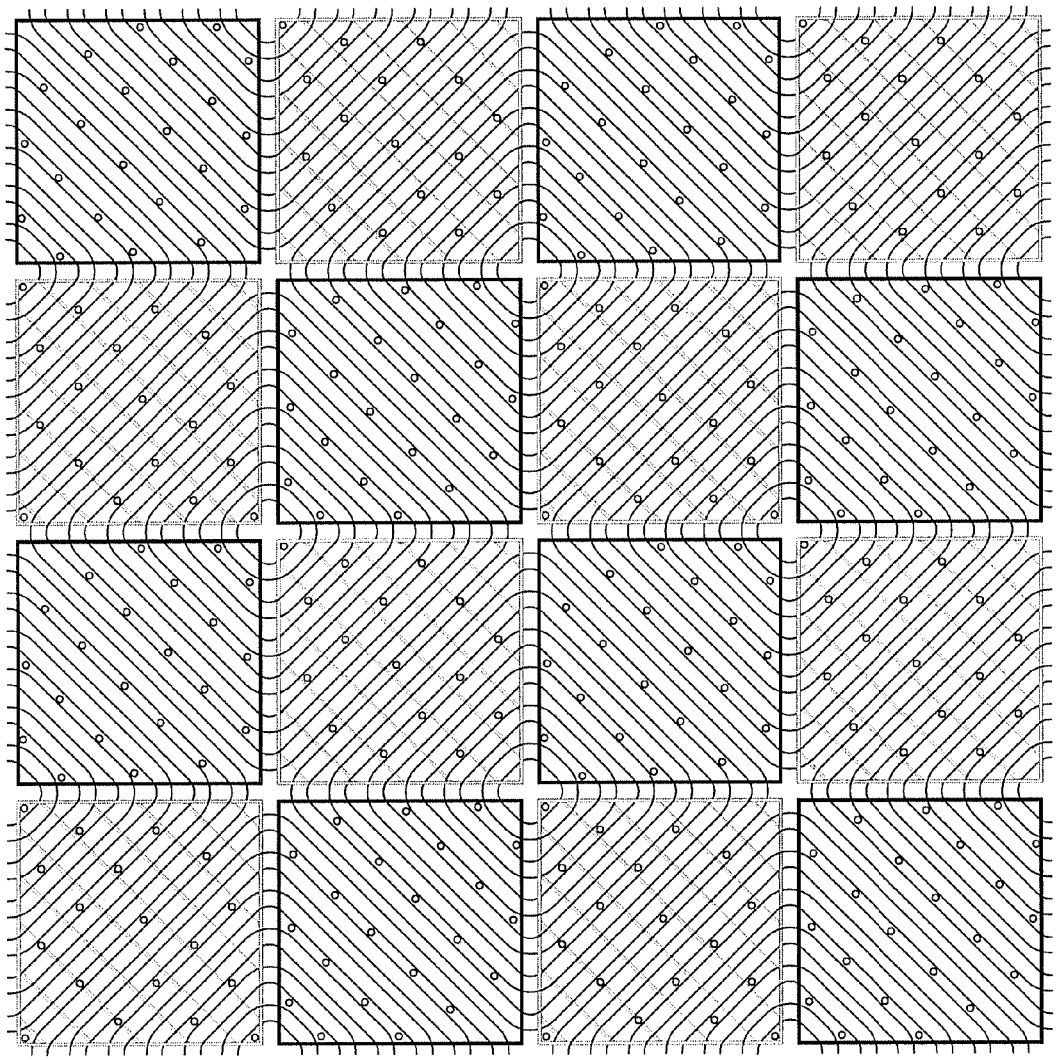
FIG. 28 is a plan view of a nitride semiconductor diode having yet another embodiment of a concentric island topography.

In yet another embodiment, the relative position of the pads with respect to the underlying concentric tracks can be aligned diagonally as shown in FIG. 28. This design arrangement can be used for very high voltage devices because the corners of the underlying concentric tracks are positioned in the area between the metal island pads. In the example of a diode structure, this area can be conveniently made inactive by placing field isolation oxide or nitride so that no diode action is present at the high voltage stressed corner.

In another embodiment, the nitride semiconductor devices using the island topography can be used to build basic circuit blocks for a monolithic power integrated circuit (MPIC). An MPIC includes several semiconductors and even several types of semiconductors to form a complete or partially complete monolithic structured integrated circuit that can be used in a variety of applications such as switch based amplifiers, power conversion circuits, point of load regulators and switched mode power supplies.

Figure 29:
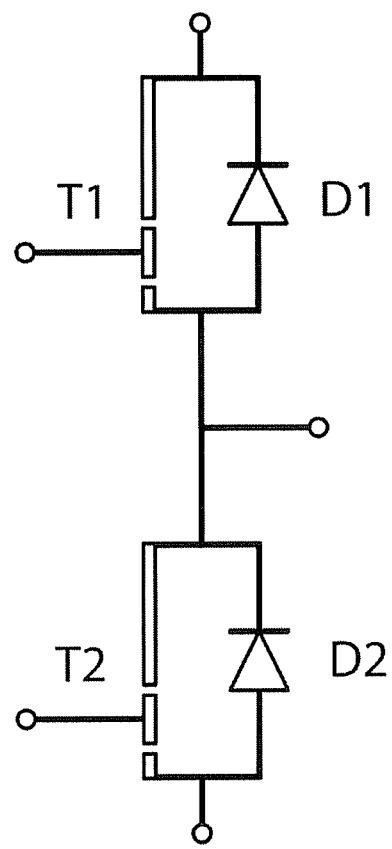
FIG. 29 is a schematic diagram of a half-bridge circuit.

For example, a useful and widely used circuit arrangement is the half-bridge circuit shown in FIG. 29. This circuit is normally built using discrete MOSFET transistors. When used for high current, high voltage and high speed applications the circuit function is often impaired by the inductance of the wiring between the transistors and the poor on-resistance and speed of MOSFET devices. The diodes shown are often the intrinsic body diodes of the MOSFET which usually has unwanted charge storage effects that impair the ability of the half-bridge to operate at high speed. Many benefits can be obtained if the entire circuit, including the diodes, is integrated together in a monolithic GaN integrated circuit.

Figure 30:
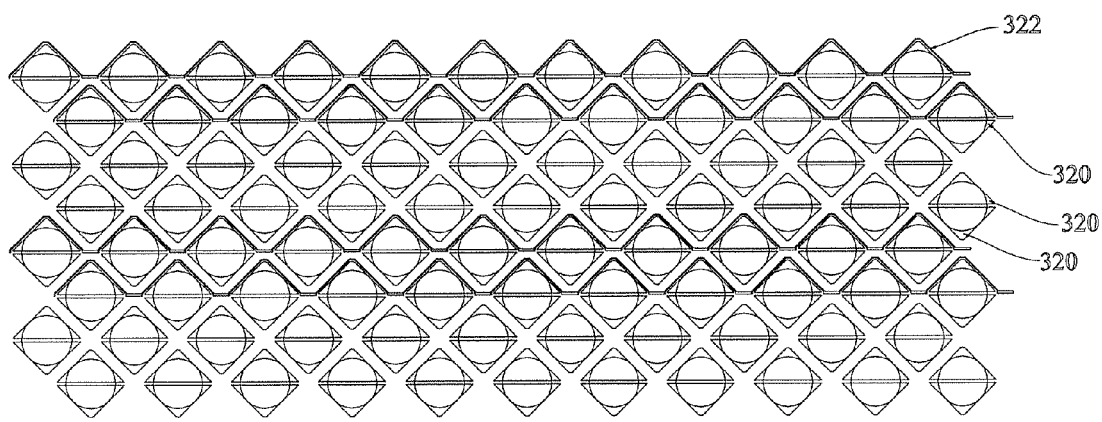
FIG. 30 is a plan view of half-islands arranged in rows.

In the island structure of FIG. 30, the square shaped islands are split into two half-islands 320. Gate tracks 322 are selectively placed between some of the adjacent half-islands 320 to form HEMTs and not placed between other half-islands to form diodes. The structure can be viewed as having horizontal rows of half-islands, each half-island within the row for performing the same electrical function. From the structure of FIG. 30, circuits can be formed by connecting diagonal sequences of half-islands in either direction. In FIG. 30, the gate tracks are deposited on every other two rows of islands. It can be appreciated that alternative placements of gate tracks can be used to accommodate a variety of circuit configurations.

Figure 31:
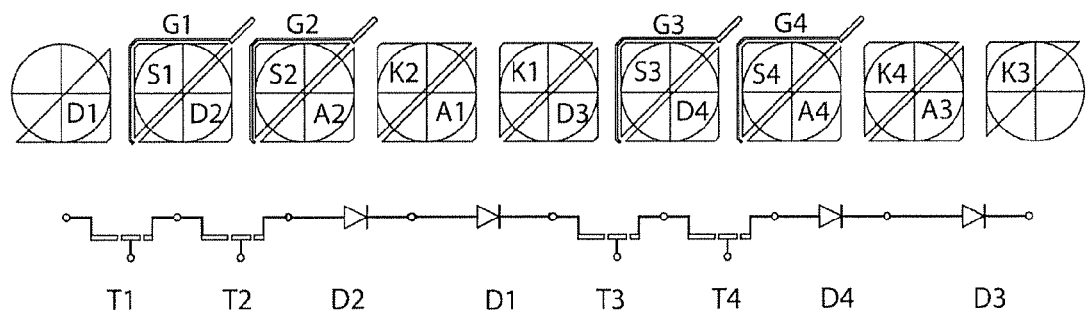
FIG. 31 is a plan view of half-islands implementing a half-bridge or full-bridge circuit and the corresponding schematic diagram.

As an example, a monolithic GaN half/full-bridge integrated circuit is shown in FIG. 31 using the island topography of FIG. 30. In this example, the mapping of the physical device layout to the equivalent electrical schematic symbol is the following:

D1, G1, and S1 are the drain, gate and source for the T1 transistor,

D2, G2, and S2 are the drain, gate and source for the T2 transistor,

A2, and K2 are the anode and cathode for the D2 diode,

A1, and K1 are the anode and cathode for the D1 diode,

D3, G3, and S3 are the drain, gate and source for the T3 transistor,

D4, G4, and S4 are the drain, gate and source for the T4 transistor,

A4, and K4 are the anode and cathode for the D4 diode, and

A3, and K3 are the anode and cathode for the D3 diode.

Figure 32:
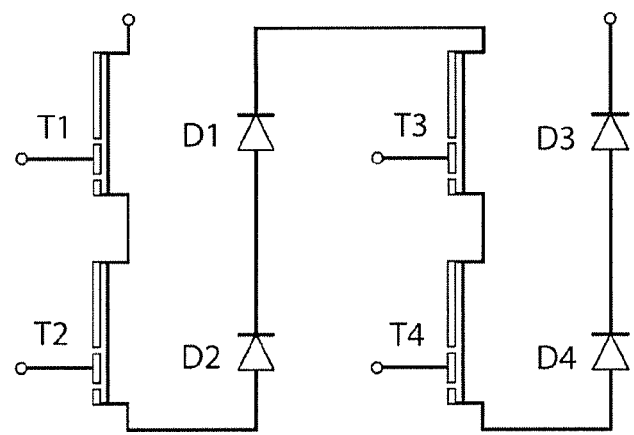
FIG. 32 is another schematic diagram of the full-bridge circuit of FIG. 31.

The sequence of transistors and diodes forming the circuit of FIG. 31 is reproduced in FIG. 32 in a more conventional schematic representation of a half/full-bridge circuit.

Figure 33:
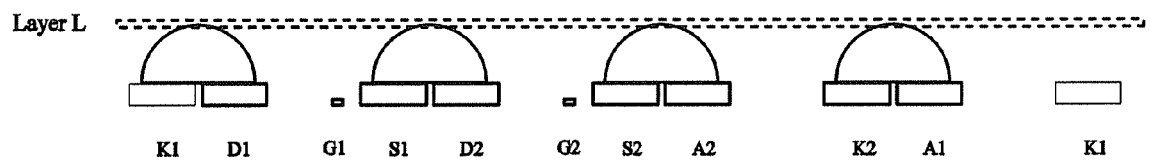
FIG. 33 is a cross-section view of half-islands arranged in a row.

Each of the half-islands which are used to form HEMTs can be formed using an ohmic contact material to provide source electrode Sx or drain electrode Dx. The gate electrode Gx can be formed by depositing a Schottky metal in a strip shape between the adjacent source and drain half-islands, as shown in FIG. 33. Each of the half-islands which are used to form the high electron mobility power diodes can be formed using either an ohmic material to form a cathode Kx or a Schottky metal to form an anode Ax also shown in FIG. 28.

Each of the split islands is electrically contacted by means of a conductive layer L, thus providing some of the half-bridge circuit interconnect. The remainder of the interconnections can be done by a plurality of means, including on the GaN semiconductor device with additional interconnection layers, or by external means using packaging or printed circuit board interconnections. The external means can be accomplished using bumped flip-chip technology with the same pitched island patterns.

Figure 34:
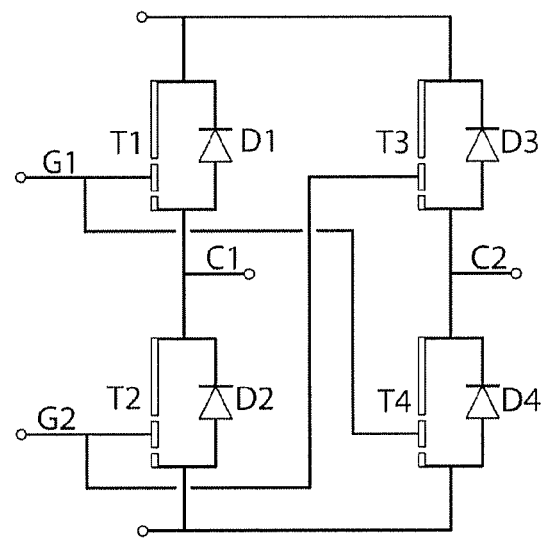
FIG. 34 is a schematic diagram of a clamped full-bridge rectifier power circuit.
Figure 35:
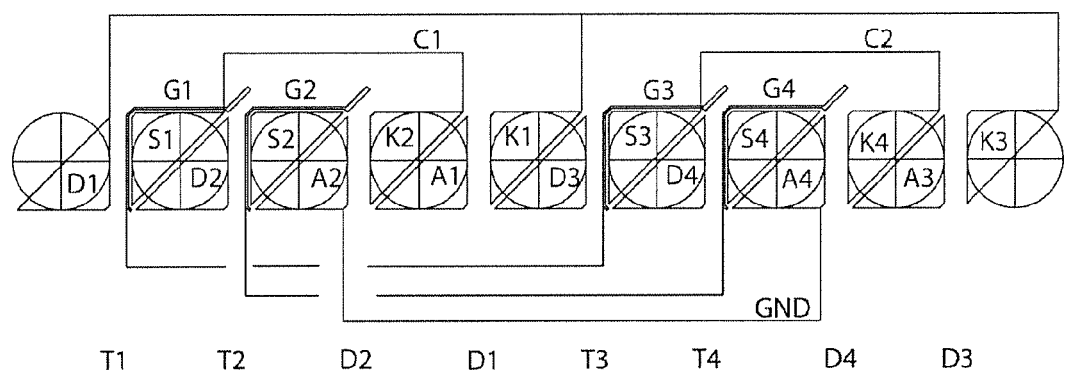
FIG. 35 is a plan view of half-islands with interconnections implementing the circuit of FIG. 34.

As another example, the clamped full-bridge rectifier power circuit schematically represented in FIG. 34 is implemented using the island topography shown in FIG. 35.

Although the invention has been described with reference to certain specific embodiments, various modifications thereof will be apparent to those skilled in the art without departing from the spirit and scope of the invention as outlined in the claims appended hereto.

What is claimed is:

1. A semiconductor device comprising:
   a) a substrate;
   b) a nitride semiconductor layer comprising a nitride semiconductor hetero-layer formed on a main surface of the substrate;
   c) a metallization layer formed on the nitride semiconductor layer defining an array of a plurality of first island electrodes and a plurality of second island electrodes spaced apart from each other and arranged with alternating first island electrodes and second island electrodes in at least two orthogonal directions to produce two-dimensional active regions in areas of the nitride semiconductor layer, with:
- i) at least one side of each of the first island electrodes opposite a side of the adjacent second island electrodes;
- ii) at least one side of each of the second island electrodes opposite a side of adjacent first island electrodes; and
- iii) wherein the first island electrodes and second island electrodes serve as source island electrodes and drain island electrodes of a multi-island transistor, or, as anode island electrodes and cathode island electrodes of a multi-island diode;

d) each of the plurality of first island electrodes providing a contact area (pad) for a respective individual first external connection; and e) each of the plurality of second island electrodes providing a contact area (pad) for a respective individual second external connection; and f) wherein:
- i) said respective individual first and second external connections each comprise a ball, bump or post connection, each first island electrode and each second island electrode having its own individual ball, bump or post connection formed thereon, without on-chip common connections between the first island electrodes and without on-chip common connections between the second island electrodes;
or
- ii) said first external connections each comprise a substrate via connection and said second external connections each comprise a ball, bump or post connection, each second island electrode having its own individual ball, bump or post connection formed thereon, without on-chip common connections between the second island electrodes;
or
- (iii) said first external connections each comprise a ball, bump or post connection, each first island electrode having its own individual ball, bump or post connection formed thereon, without on-chip common connections between the first island electrodes and said second external connections each comprise a substrate via connection.

2. The device of claim 1 wherein said first and second island electrodes are each a four-sided figure.

3. The device of claim 1, wherein said island electrodes islands are triangular shaped.

4. The device of claim 1, wherein said island electrodes are a combination of various variants of polygon shapes that allow said alternative arrangement.

5. The device of claim 1, wherein the plurality of first and second island electrodes serve, respectively, as source island electrodes and drain island electrodes of a multi-island transistor, and further comprising:
a plurality of gate strip electrodes formed on the nitride semiconductor layer in regions between source island electrodes and drain island electrodes, and a low resistance metal strap connecting each gate electrode at interstices defined by adjacent vertices of source island electrodes and drain island electrodes, said metal strap connecting said gate electrodes to a plurality of gate pads for external gate connections.

6. The device of claim 1, further comprising one or more epitaxial layers in between said substrate and said nitride semiconductor layer.

7. The device of claim 6, further comprising a plurality of epitaxial layers and one or more field plates, wherein each said field plate is positioned between successive epitaxial layers.

8. The device of claim 1, wherein the nitride semiconductor hetero-layer comprises a layer of undoped gallium nitride beneath a layer of undoped aluminum gallium nitride.

9. The semiconductor device of claim 1, wherein the first and second island electrodes, respectively, serve as source and drain island electrodes of a multi-island transistor, and further comprising
- f) a plurality of gate strip electrodes formed on the nitride semiconductor layer in regions between first island electrodes and second island electrodes;
- g) the plurality of gate strip electrodes being interconnected by interconnections at interstices defined by vertices of the first island electrodes and the second island electrodes; and
- h) a plurality of third external connections connected to the plurality of gate strip electrodes.

10. The semiconductor device of claim 9 further comprising a low resistance metal strap connecting each gate strip electrode to the plurality of third external connections.

11. The semiconductor device of claim 9, wherein the plurality of first external connections are through substrate vias, and the plurality of second external connections are metal pads with metalized bumps.

12. The semiconductor device of claim 9, wherein the source and drain island electrodes each have a substantially square shape.

13. The semiconductor device of claim 9 wherein the source island electrodes and drain island electrodes each have a substantially square shape, a distance $L_{ds}$ between each source island electrode and drain island electrode is the total of a source island to gate edge spacing, a gate length $L_g$, and a drain island to gate edge spacing $L_{dg}$, and a length $L_{island}$ of each side of the square shape is in a range between 75% and 125% of the distance $L_{ds}$ between adjacent drain island electrodes and source island electrodes.

14. The semiconductor device of claim 13, $L_{island}$ is in a range between 90% and 110% of the distance $L_{ds}$ between adjacent drain island electrodes and source island electrodes.

15. The semiconductor device of claim 14, wherein $L_{island}$ is approximately equal to the distance $L_{ds}$ between adjacent drain island electrodes and source island electrodes.

16. The semiconductor device of claim 13 wherein $L_{island}$ is in the range from 10 μm to 100 μm.

17. The semiconductor device of claim 13, wherein $L_{sg}$ is close to a minimum allowed by layout design rule limitations and $L_{dg}$ provides a predetermined breakdown voltage.

18. The semiconductor device of claim 9, further comprising one or more epitaxial layers in between the substrate and the nitride semiconductor layer.

19. The semiconductor device of claim 18, wherein one epitaxial layer is very lightly doped.

20. The semiconductor device of claim 9, further comprising a plurality of epitaxial layers and further comprising one or more field plates, wherein each the field plate is positioned between successive epitaxial layers.

21. The semiconductor device of claim 9, wherein the gate electrode is formed from palladium, and wherein the metallization layer defining the source and drain island electrodes is formed from titanium and aluminium.

22. The semiconductor device of claim 9, wherein the first and second external connections each include a thermal sink.

* * * * *